United States Patent
Gubser et al.

(10) Patent No.: US 10,199,412 B2
(45) Date of Patent: Feb. 5, 2019

(54) OPTOELECTRONIC MODULES INCLUDING AN IMAGE SENSOR HAVING REGIONS OPTICALLY SEPARATED FROM ONE ANOTHER

(71) Applicant: Heptagon Micro Optics Pte. Ltd., Singapore (SG)

(72) Inventors: Simon Gubser, Weesen (CH); Sonja Hanselmann, Lachen (CH); Qichuan Yu, Singapore (SG); Cris Calsena, Singapore (SG); Guo Xiong Wu, Singapore (SG); Hartmut Rudmann, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/329,112

(22) PCT Filed: Jul. 22, 2015

(86) PCT No.: PCT/SG2015/050224
§ 371 (c)(1),
(2) Date: Jan. 25, 2017

(87) PCT Pub. No.: WO2016/013977
PCT Pub. Date: Jan. 28, 2016

(65) Prior Publication Data
US 2017/0229505 A1 Aug. 10, 2017

Related U.S. Application Data

(60) Provisional application No. 62/156,416, filed on May 4, 2015, provisional application No. 62/053,294, filed
(Continued)

(51) Int. Cl.
*H01L 27/146* (2006.01)
*H01L 25/04* (2014.01)

(52) U.S. Cl.
CPC ...... *H01L 27/14618* (2013.01); *H01L 25/042* (2013.01); *H01L 27/14623* (2013.01);
(Continued)

(58) Field of Classification Search
CPC ....... H01L 23/28; H01L 25/50; H01L 25/042; H01L 27/14618; H01L 27/14623;
(Continued)

(56) References Cited

U.S. PATENT DOCUMENTS 8,772,898 B2 7/2014 Mao et al.
9,368,529 B2 6/2016 Eisele et al.
(Continued)

FOREIGN PATENT DOCUMENTS

CN 103124912 A 5/2013
CN 103247647 A 8/2013
(Continued)

OTHER PUBLICATIONS

International Search Report and Written Opinion issued by ISA/AU for PCT/SG2015/050224 (dated Nov. 11, 2015).
State Intellectual Property Office of People's Republic of China, Search Report in Chinese patent application No. 2015800447817 (1 page) (dated Nov. 13, 2018) (with English translation).

*Primary Examiner* — Matthew Landau
*Assistant Examiner* — Mark Hatzilambrou
(74) *Attorney, Agent, or Firm* — Fish & Richardson P.C.

(57) ABSTRACT

This disclosure describes optoelectronic modules that include an image sensor having at least two regions separated optically from one another by a wall. The wall can include a bridge portion that extends over the image sensor and further can include a cured adhesive portion, part of which is disposed between a lower surface of the bridge portion and an upper surface of the image sensor. Various techniques are described for fabricating the modules so as to help prevent the adhesive from contaminating sensitive regions of the image sensor. The wall can be substantially
(Continued)

light-tight so as to prevent undesired optical cross-talk, for example, between a light emitter located to one side of the wall and a light sensitive region of the image sensor located to the other side of the wall.

5 Claims, 23 Drawing Sheets

Related U.S. Application Data on Sep. 22, 2014, provisional application No. 62/028,893, filed on Jul. 25, 2014.

(52) U.S. Cl.
CPC .. *H01L 27/14634* (2013.01); *H01L 27/14636* (2013.01); *H01L 27/14685* (2013.01); *H01L 27/14687* (2013.01)

(58) Field of Classification Search
CPC ......... H01L 27/14634; H01L 27/14636; H01L 27/14685; H01L 27/14687; H01L 31/12; H01L 31/125; H01L 31/18
See application file for complete search history.

(56) References Cited

U.S. PATENT DOCUMENTS

| | | | |
|---|---|---|---|
| 9,966,493 | B2 | 5/2018 | Rudmann et al. |
| 2001/0020738 | A1 | 9/2001 | Iizima et al. |
| 2002/0084432 | A1 | 7/2002 | Sugiyama et al. |
| 2002/0176066 | A1 | 11/2002 | Nakagawa |
| 2004/0263824 | A1 | 12/2004 | Yamamoto et al. |
| 2007/0090275 | A1 | 4/2007 | Toyoda et al. |
| 2007/0145242 | A1 | 6/2007 | Toyoda et al. |
| 2008/0007623 | A1 | 1/2008 | Lee et al. |
| 2013/0164867 | A1* | 6/2013 | Ramasamy ....... H01L 27/14618 438/25 |
| 2013/0265590 | A1 | 10/2013 | Eisele et al. |
| 2014/0203390 | A1 | 7/2014 | Nishikido et al. |
| 2015/0036046 | A1* | 2/2015 | Rudmann ............ H04N 5/2252 348/374 |

FOREIGN PATENT DOCUMENTS

| | | |
|---|---|---|
| CN | 103620779 A | 3/2014 |
| CN | 103839840 A | 6/2014 |
| WO | WO 2013/161722 A1 | 10/2013 |

\* cited by examiner

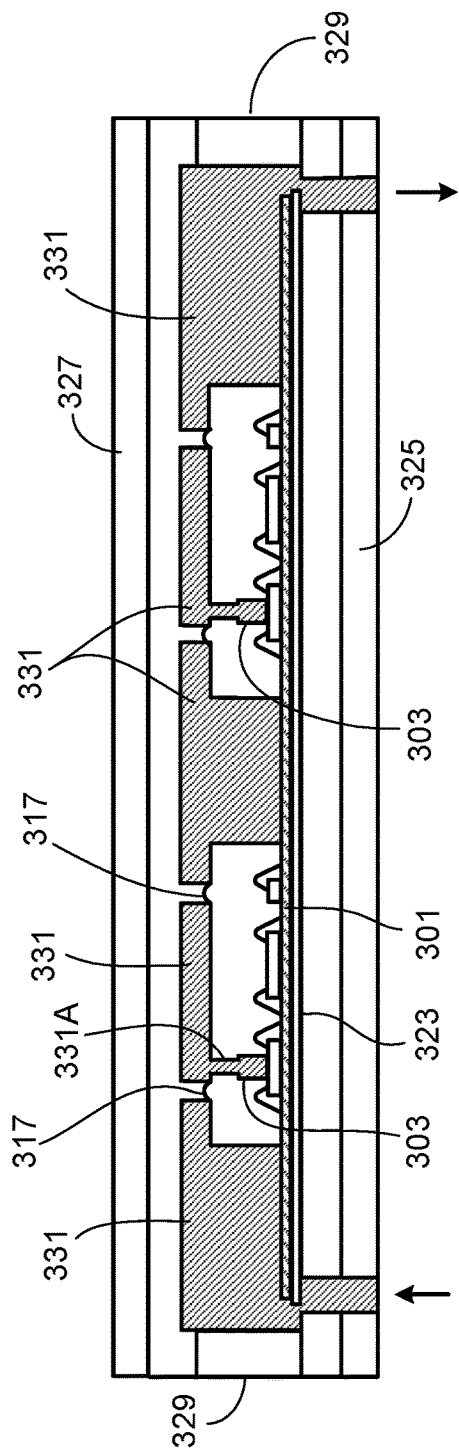
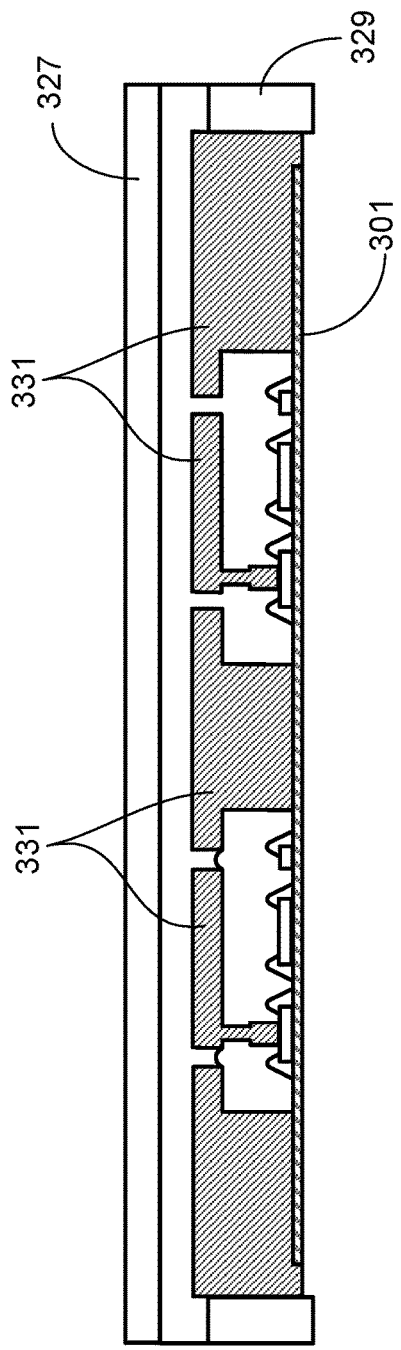
FIG. 15F
FIG. 15G

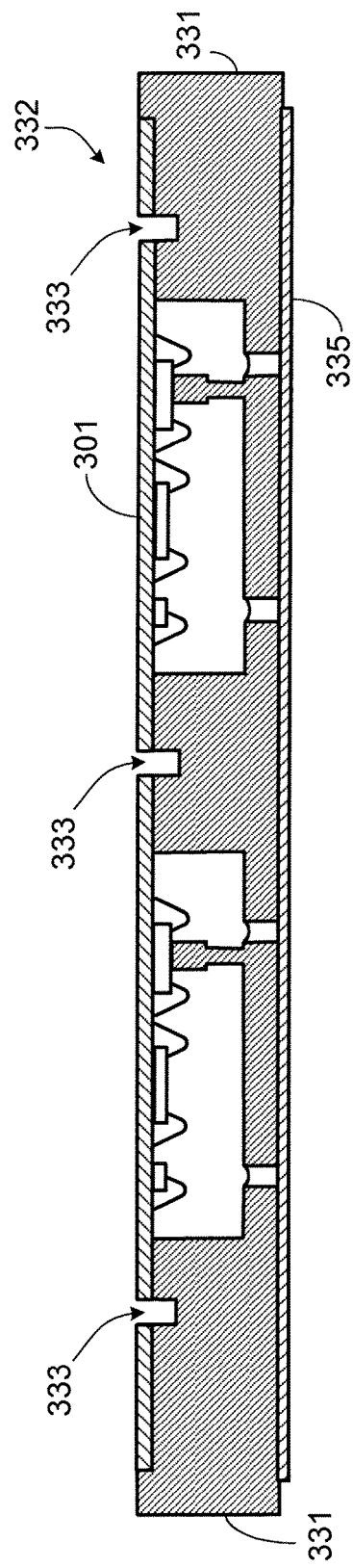
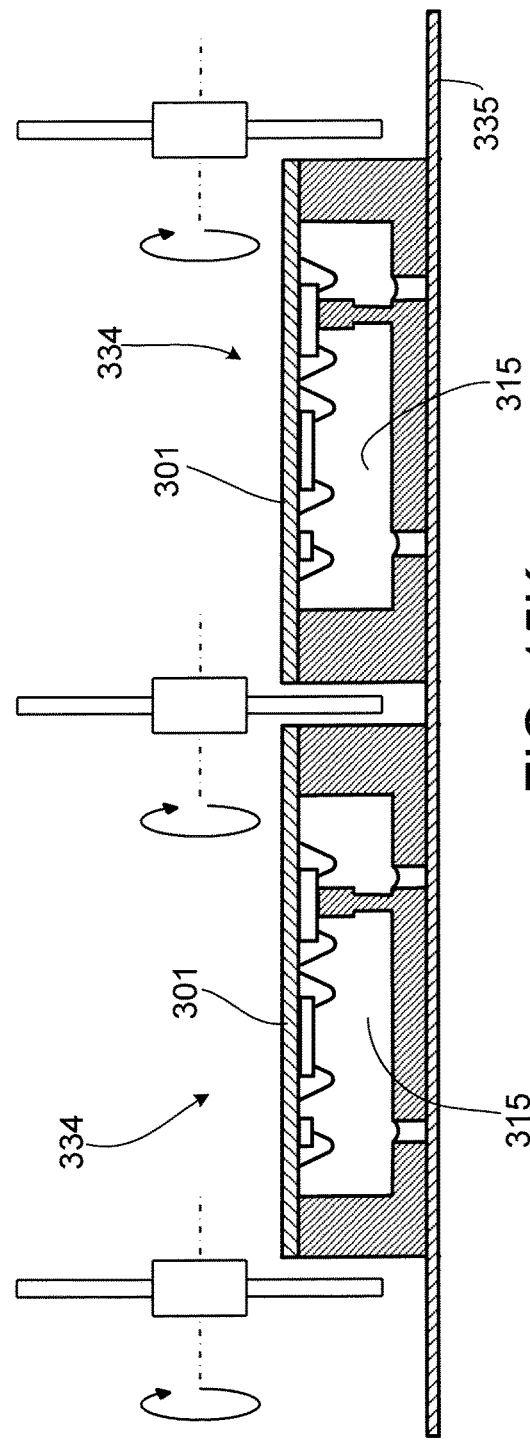
FIG. 15J
FIG. 15K

OPTOELECTRONIC MODULES INCLUDING AN IMAGE SENSOR HAVING REGIONS OPTICALLY SEPARATED FROM ONE ANOTHER

CROSS-REFERENCE TO RELATED APPLICATION(S)

This application is the National Stage of International Application No. PCT/SG2015/050224, filed on Jul. 22, 2015, which claims the benefit of priority U.S. Application No. 62/028,893, filed on Jul. 25, 2014 and U.S. Application No. 62/028,893, filed on Sep. 22, 2014. The disclosure of the prior applications is incorporated herein by reference.

TECHNICAL FIELD

This disclosure relates to optoelectronic modules including an image sensor having regions optically separated from one another.

BACKGROUND

Optoelectronic modules that include a light emitter and a light sensor can be used in a wide range of applications including, for example, proximity sensing, gesture sensing and camera imaging. Such modules can be integrated, for example, into various consumer electronics such as hand-held computing devices (e.g., smart phones) or other host devices.

Some sensors include multiple regions sensitive to radiation from the emitter. Thus, in some cases it can be advantageous to implement a contiguous sensor with two distinct regions where the two regions are isolated optically from one another. For example, it may be desirable in some cases for radiation from the emitter to be able to impinge on a first light sensitive region of the sensor, but not to impinge on a second light sensitive region (except, for example, where the light is emitted from the module and reflected by an object outside the module back toward the sensor so that the reflected light can be detected).

To separate the different regions of the sensor, a divider is needed that is not transparent to the emitted radiation. Further, the divider should be substantially light tight so that substantially no light can pass directly from one chamber in which the first region is located to the other chamber where the second region is located.

SUMMARY

This disclosure describes optoelectronic modules that include an image sensor having at least two regions separated optically from one another by a wall. The wall can include a bridge portion that extends over the image sensor and further can include a cured adhesive portion, part of which is disposed between a lower surface of the bridge portion and an upper surface of the image sensor. Various techniques are described for fabricating the modules so as to help prevent the adhesive from contaminating sensitive regions of the image sensor (e.g., optically sensitive regions or other regions of the image sensor that are, or may be, sensitive to contamination by the adhesive). Preferably, the wall is substantially light-tight so as to prevent undesired optical cross-talk, for example, between a light emitter located to one side of the wall and a light sensitive region of the image sensor located to the other side of the wall.

For example, according to one aspect, an optoelectronic module includes a contiguous image sensor including a first region and a second region. A wall separates the module into first and second channels. The first region of the image sensor is disposed in the first channel, whereas the second region of the image sensor is disposed in the second channel. The wall is substantially opaque to, or significantly attenuates, light at one or more wavelengths detectable by the image sensor. Further, the wall includes a bridge region that spans across the image sensor. The wall further includes adhesive that substantially fills an area between the bridge region and an upper surface of the image sensor.

Some implementations include one or more of the following features. For example, adhesive also may be present in areas adjacent side-edges of the image sensor. In some cases, the bridge region has one or more adhesive-filled conduits. The bridge region may have narrow portions, each of which faces a respective one of the first or second regions of the image sensor.

In some cases, the module includes a substrate on which the image sensor mounted. A spacer separates the substrate from an optics assembly over the channels. At least a portion of the bridge region can be composed of the same material as the spacer and is formed as a single contiguous unitary piece with the spacer.

The first and second regions of the image sensor may be regions that are sensitive to contamination by adhesive (e.g., light sensitive regions). A portion of the adhesive over the image sensor may form an overflow meniscus that does not, however, reach the first or second regions.

In another aspect, a method of fabricating an optoelectronic module includes providing a spacer attached to a substrate. An image sensor is mounted on the substrate, and a bridge portion spans across the image sensor. The bridge portion is composed of the same material as the spacer and is formed as a single contiguous unitary piece with the spacer. The method further includes providing an adhesive in a space between the bridge portion and an upper surface of the image sensor, and in spaces between side-edges of the image sensor and opposing inner edges of the spacer. Subsequently, the adhesive is cured.

Some implementations include one or more of the following features. In some cases, for example, the adhesive is dual-cure adhesive, and the method includes partially curing the adhesive using a first technique (e.g., a UV cure), and subsequently completing curing of the adhesive using a second technique (e.g., a thermal cure) after performing other fabrication steps. In some instances, the method includes continuously pre-curing an overflow meniscus, formed by the adhesive, wherein the pre-curing is performed as the adhesive is being provided in the space between the bridge portion and an upper surface of the image sensor. After performing other fabrication steps, curing of the adhesive can be completed. In some cases, the adhesive can be provided by injecting the adhesive into one or more conduits in the bridge portion.

In accordance with another aspect, a wafer-level method of fabricating optoelectronic modules includes providing a substrate on which are mounted a plurality of image sensor chips, and providing a respective foundation layer of black epoxy over each of the image sensor chips such that one light sensitive region of the image sensor chip is located to a first side of the foundation layer and a second light sensitive region of the image sensor chip is located to a second side of the foundation layer. The method further includes providing an overmold of clear epoxy over the image sensor chips, and selectively removing the clear epoxy from areas directly over the foundation layers so as to form a respective first trench directly over each foundation layer. An injection process is performed to fill the first trenches with black epoxy and simultaneously to form an outer housing of black epoxy for the modules.

According to another aspect, a method of fabricating an optoelectronic module includes providing a spacer defining a frame that has openings corresponding to optical channels for the module. A surface of the spacer includes a bridge region between the openings. The method includes pushing epoxy through a plurality of different screens to build up a wall on the bridge region. A substrate, on which an image sensor chip is mounted, is attached to an epoxy-side of the spacer, such that the epoxy wall extends across a surface of the image sensor chip. An optics assembly is attached over the spacer such that the epoxy wall separates the module into two chambers that are optically isolated from one another.

The dimensions of the bridge can be such that surface forces prevent the adhesive from flowing onto regions of the image sensor that are sensitive to contamination by adhesive.

Other aspects, features and advantages will be apparent from the following detailed description, the accompanying drawings, and the claims.

BRIEF DESCRIPTION OF THE DRAWINGS

FIGS. 15A-15L illustrate a wafer-level method of fabricating optoelectronic modules.

DETAILED DESCRIPTION

Figure 1A:
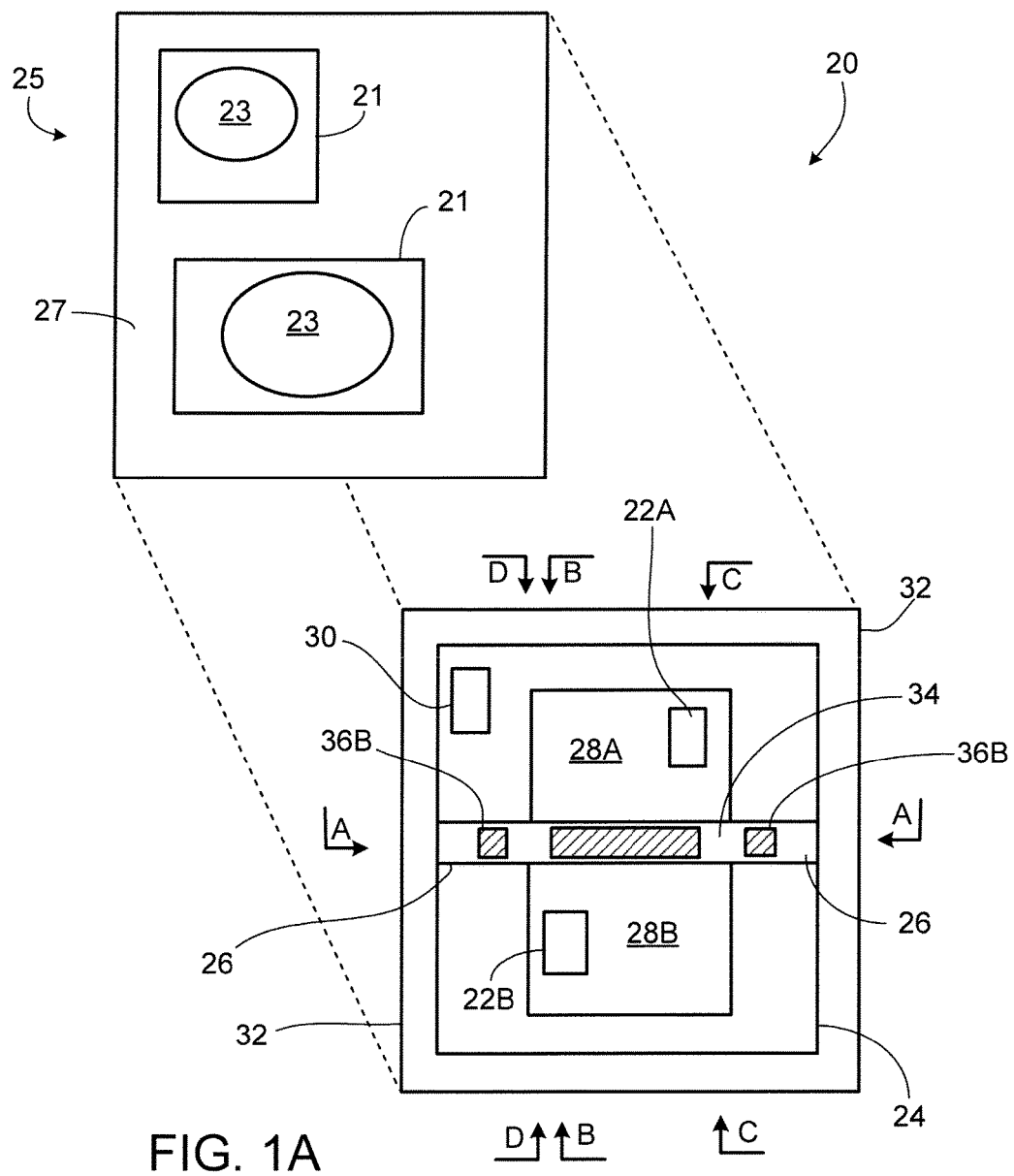
FIG. 1A is an exploded view of an example of an optoelectronic module.
Figure 1B:
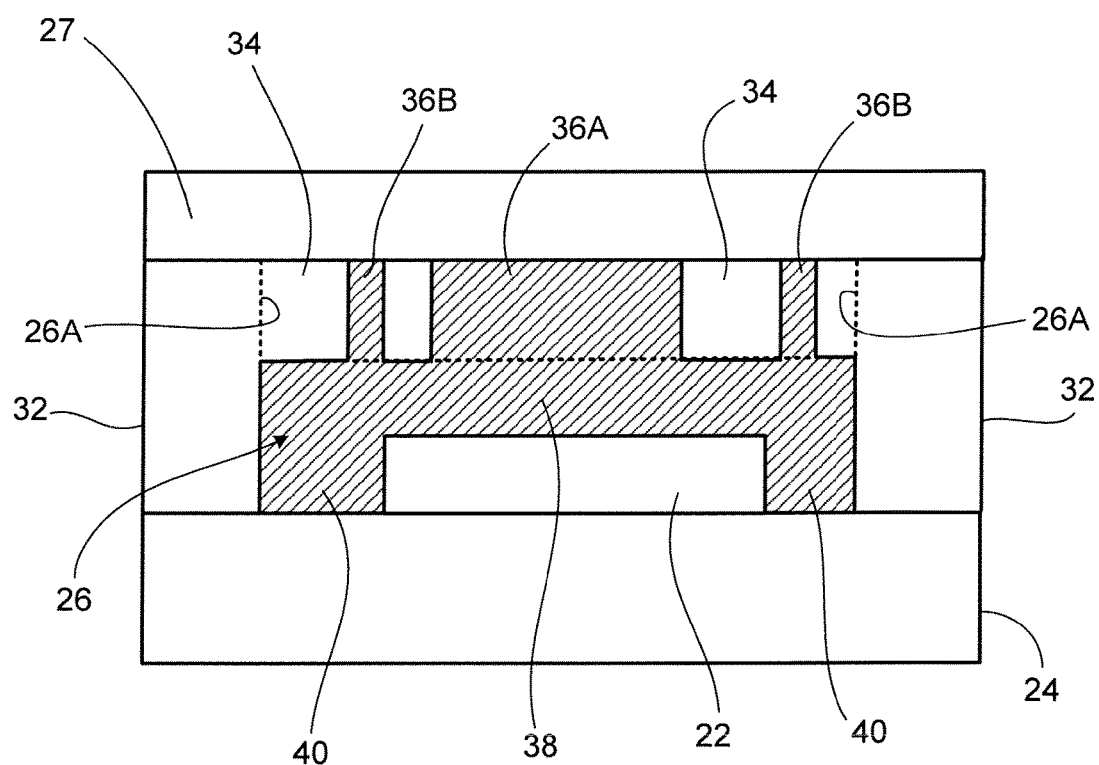
FIG. 1B is a cross-sectional side view of the module of FIG. 1A taken along line A-A.

As shown in FIGS. 1A-1B, an optoelectronic module 20 includes an image sensor 22 (e.g., a CCD or CMOS sensor) on a printed circuit board (PCB) or other substrate 24. The image sensor 22 is implemented as a contiguous sensor that includes at least two different regions 22A, 22B, each of which includes respective light sensitive areas (e.g., pixels). A wall 26 separates the module into two distinct chambers or optical channels 28A, 28B, each of which contains a respective one of the image sensor regions 22A, 22B. One of the channels (e.g., 28A) includes a light emitter 30 mounted on the substrate 24. The light emitter 30 can be implemented, for example, as a light emitting diode (LED), infra-red (IR) LED, organic LED (OLED), infra-red (IR) laser or vertical cavity surface emitting lasers (VCSEL), depending on the application.

The pixels in the region 22A of the image sensor 22 can be used, for example, to provide reference signals based on light emitted from the light emitter 30. The pixels in the other region 22B of the image sensor 22 can be used, for example, to provide detection signals indicative, for example, of light reflected from an object outside the module. Thus, in some implementations, the module 20 is arranged for proximity sensing. In such applications, light emitted by the emitter 30 is directed toward an object outside the module 20; a portion of the light reflected by the object may be directed back toward the module 20 and sensed by the detection pixels in the region 22B of the image sensor 22. To prevent optical cross-talk between the channels 28A, 28B, the wall 26 preferably is substantially light tight and opaque to wavelength(s) of light emitted by the light emitter 30. The module 20 may include processing circuitry to read and process signals from the image sensor. The module 20 also may include control circuitry to control turning the emitter on and off.

In the illustrated example, the wall 26 spans across the width of the image sensor 22. Each end 26A of the wall 26 is in contact with a spacer 32 that separates the PCB substrate 24 from an optics assembly 25 disposed over the channels 28A, 28B. The spacer 32, which laterally encircles the image sensor 22 and light emitter 30, can serve as outer walls of the module 20. The spacer 32 can be composed, for example, of a material that is substantially opaque to, or significantly attenuates, light at wavelength(s) emitted by the light emitter 30. For example, in some cases, the spacer 32 is composed of a flowable polymer material (e.g., epoxy, acrylate, polyurethane, or silicone) containing a non-transparent filler (e.g., carbon black, a pigment, an inorganic filler, or a dye). The optics assembly 25 can be implemented, for example, by a lens wafer 27 (e.g., a PCB wafer) that has through-holes filled with transparent material forming transmissive regions 21 on which, or in which, beam shaping elements such as lenses 23 are formed.

In the implementation of FIGS. 1A-1B, the wall 26 is composed of several regions. A bridge region 34 extends over the image sensor 22 and includes one or more adhesive-filled conduits 36A, 36B. In the illustrated example, there is a single central conduit 36A and two side-edge conduits 36B. The area 38 between the bridge region 34 of the wall 26 and the top surface of the image sensor 22 is filled with adhesive. Likewise, the areas 40 between the side-edges of the image sensor 22 and the opposing inner edge of the spacer 32 are filled with adhesive. The bridge region 34 of the wall 26(other than the adhesive-filled conduits 36A, 36B) can be composed, for example, of the same material as the spacer. Further, in some implementations, the bridge region 34 is formed as a single contiguous unitary piece with the spacer 32. In its hardened (i.e., cured) state, the adhesive in the conduits 36A, 36B and the areas 38, 40 also should be substantially opaque to, or should significantly attenuate, light at wavelength(s) emitted by the light emitter 30. In this example, the bridge 34, the adhesive-filled conduits 36A, 36B and the adhesive-filled areas 38, 40 collectively constitute the wall 26.

Figure 2:
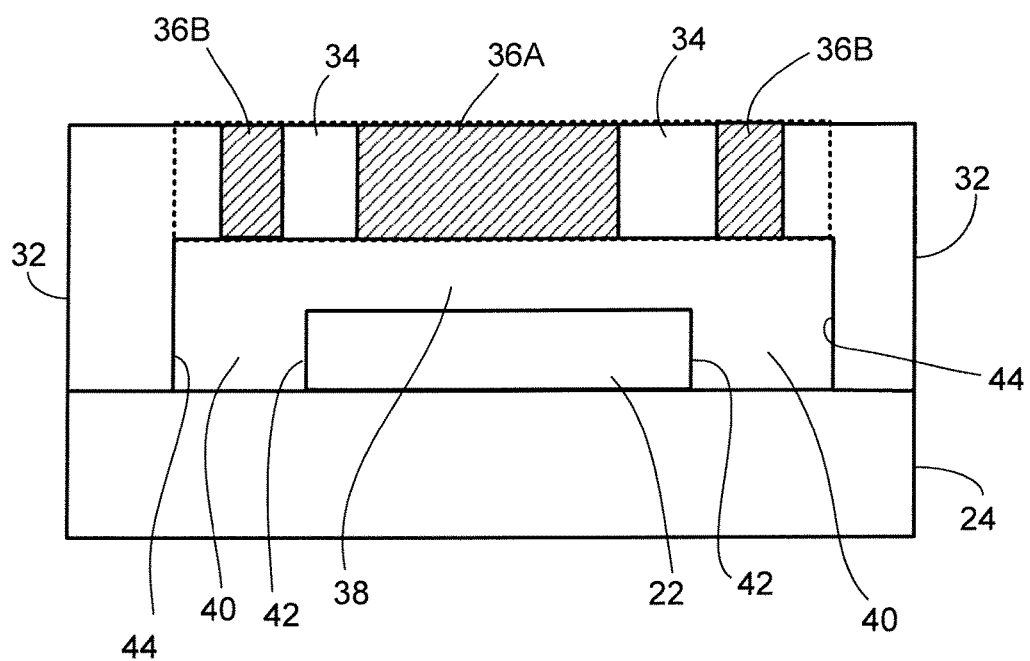
FIG. 2 is a cross-sectional side view of the module taken along line A-A in FIG. 1A prior to injection of adhesive.
Figure 3A:
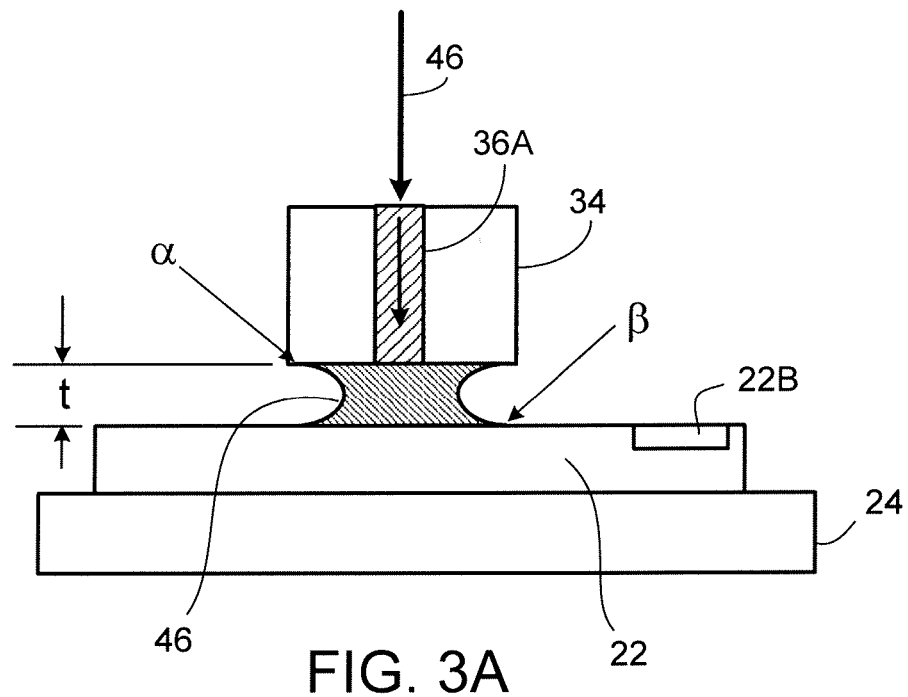
FIG. 3A is a cross-sectional end view of the module taken along line B-B in FIG. 1A during injection of adhesive.
Figure 3B:
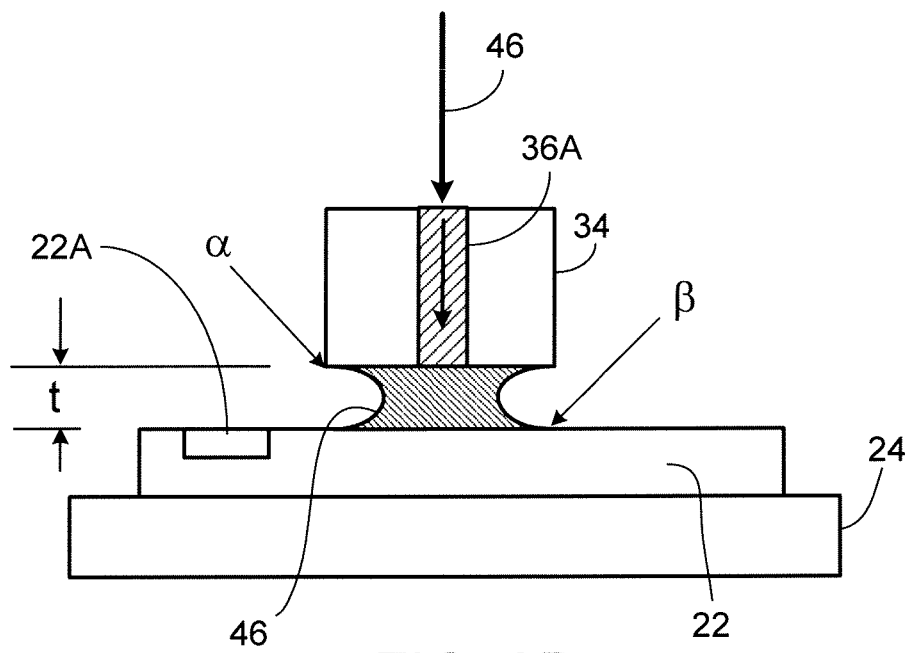
FIG. 3B is a cross-sectional end view of the module taken along line C-C in FIG. 1A during injection of adhesive.
Figure 4A:
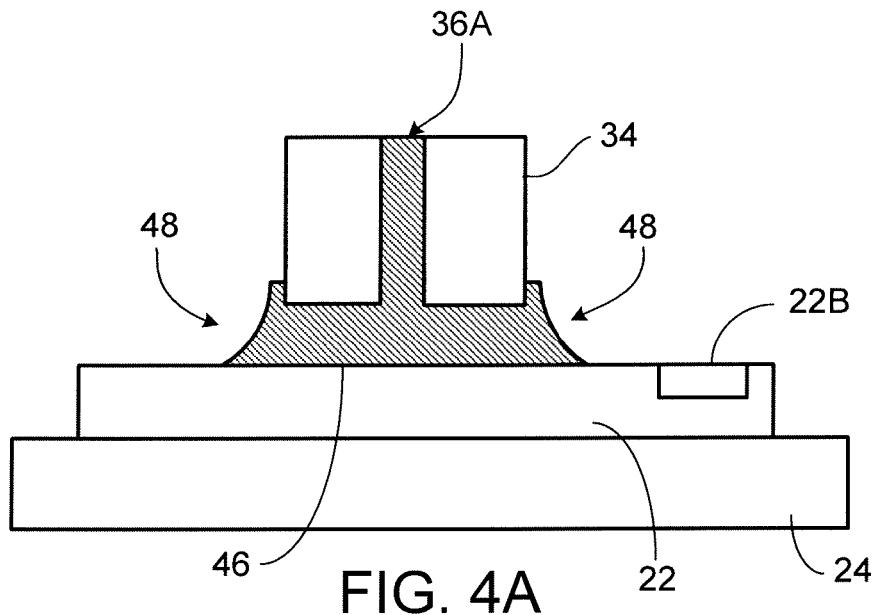
FIG. 4A is a cross-sectional end view of the module taken along line B-B in FIG. 1A after injection of adhesive.
Figure 4B:
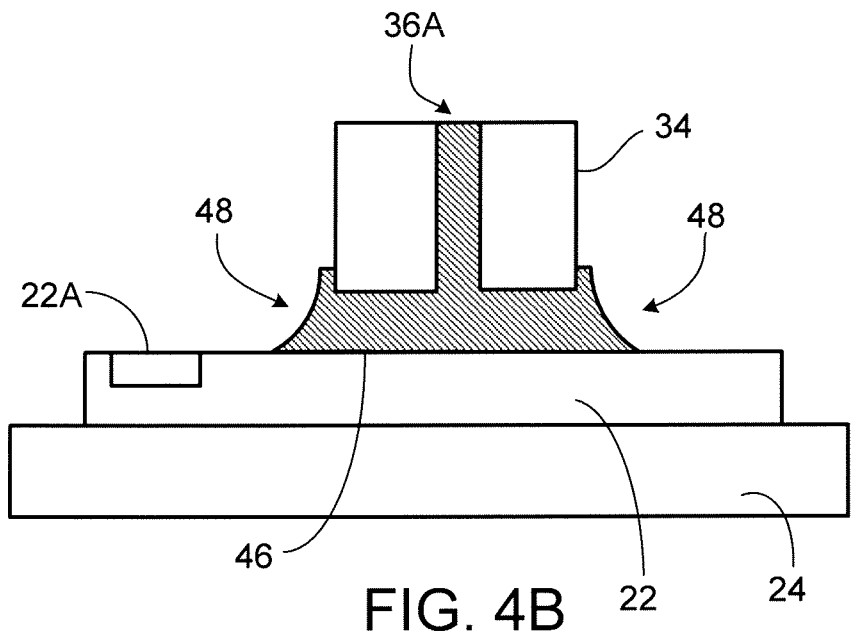
FIG. 4B is a cross-sectional view of the module taken along line C-C in FIG. 1A after injection of adhesive.

FIGS. 2 and 3A-3B illustrate a technique for forming the wall 26. First, as shown in FIG. 2, a spacer 32—formed integrally with a bridge portion 34 having conduits (i.e., openings) 36A, 36B—is attached to the PCB substrate 24 on which the image sensor 22 is mounted. The central conduit 36A of the bridge portion 34 can be disposed directly over the image sensor 22, whereas each of the side-edge conduits 36B can be disposed over a space 40 that is between a sensor side-edge 42 and an opposing inner edge 44 of the spacer 32. Then, adhesive (e.g., epoxy) 46 is injected into the conduits (i.e., central conduit 36A as shown in the end views of FIGS. 3A-3B, as well as side-edge conduits 36B). As the adhesive 46 flows through the central conduit 36A and onto the top of the image sensor 22, surface forces can prevent the adhesive 46 from flowing onto the sensitive regions 22A, 22B of the image sensor 22. The viscosity and composition of the adhesive 46, as well as the thickness (t) of the space 38 between the top surface of the image sensor 22 and the bottom of the bridge portion 34, should be selected to provide appropriate contact angles ($\alpha$ and $\beta$) such that the surface forces prevent the adhesive 46 from flowing onto the sensitive regions 22A, 22B of the image sensor 22. The adhesive 46 is allowed to continue to flow until it fills the spaces 38, 40, as well as the conduits 36A, 36B. However, as shown in FIGS. 4A-4B, the resulting overflow meniscus 48 should not be so large as to contaminate the sensitive regions of the image sensor 22 (e.g., regions 22A, 22B).

Figure 5:
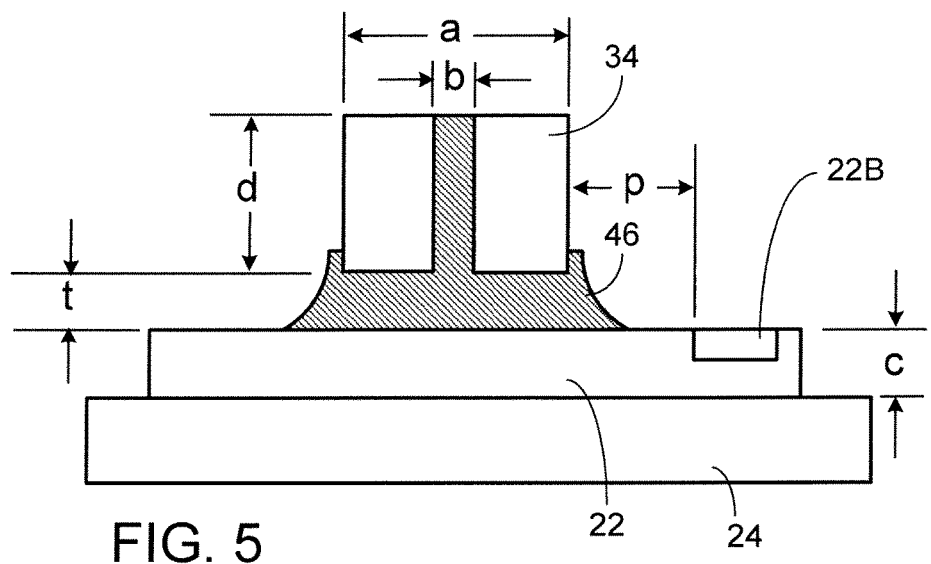
FIG. 5 is a cross-sectional end view showing various dimensions of the module of FIG. 1A.
Figure 6:
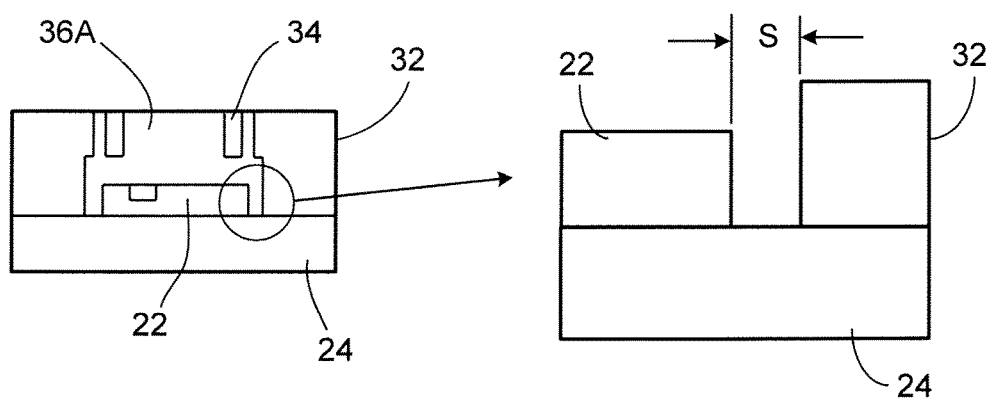
FIG. 6 is a cross-sectional side view showing further dimensions of the module of FIG. 1A.

In some implementations, a viscosity in the range of 400-7,000 (MPa·s) is suitable for the adhesive (i.e., prior to curing). For some implementations, a viscosity in the range of 3,000-6,000 (MPa·s) is advantageous. Other values may be suitable for other implementations. FIGS. 5 and 6 illustrate various dimensions of the module for some implementations. For example, the following values may be suitable in some instances:

bridge width (a): 200 µm-300 µm (e.g., 250 µm);
conduit width (b): 80 µm-120 µm (e.g., 100 µm);
image sensor height (c): 125 µm-175 µm (e.g., 150 µm);
bridge height and conduit height (d): 175 µm-225 µm (e.g., 200 µm);
width of overflow meniscus (p): 50 µm-250 µm;
width of space between sensor-edge and spacer (s): 100 µm-300 µm (e.g., 100 µm);
height of the space between top of image sensor and bottom of bridge region (t): 20 µm-100 µm (e.g., 50 µm).

The values for dimensions a, b, p and t can be particularly important to enable a proper adhesive conduction. Different values for some or all of the foregoing dimensions may be appropriate in some cases.

After injecting the adhesive 46 into the conduits 36A, 36B, the adhesive 46 can be hardened (i.e., cured), for example, by ultra-violet (UV) and/or thermal curing.

Figure 7A:
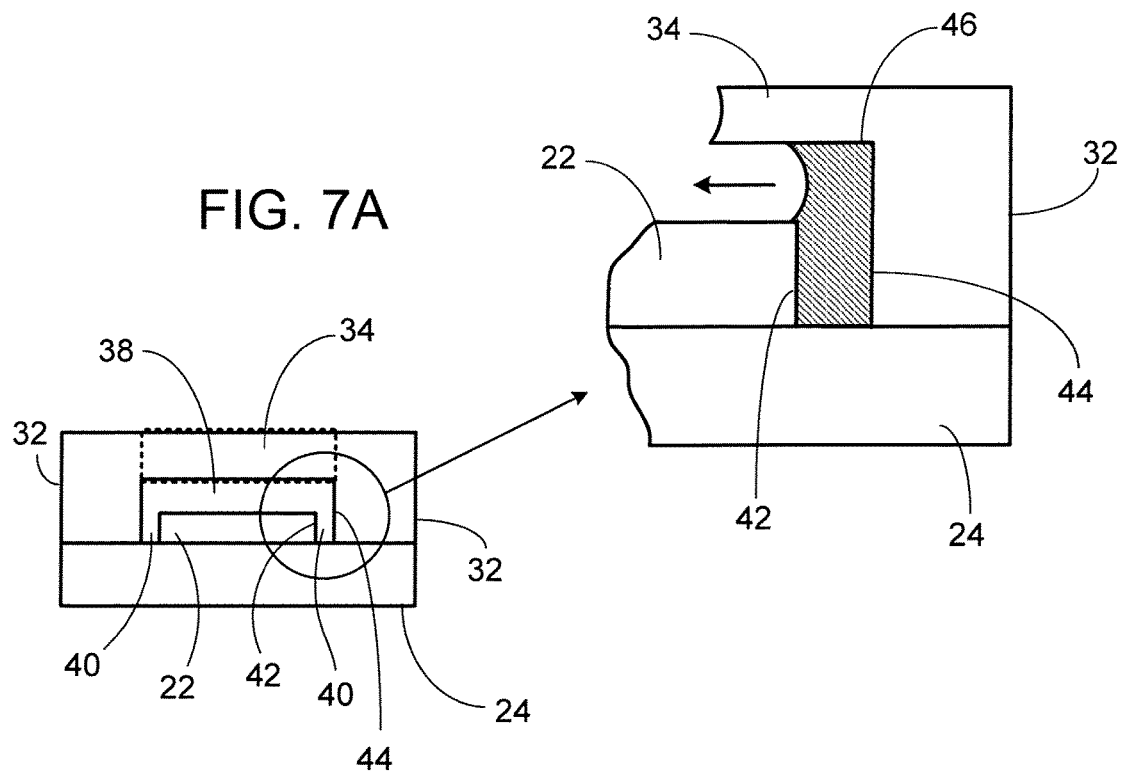
FIGS. 7A-7B illustrate injection of adhesive to form part of wall according to some implementations.
Figure 7B:
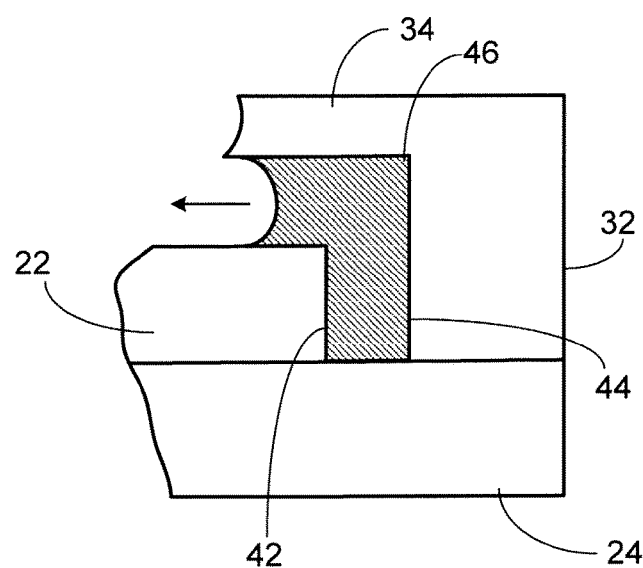
Figure 8A:
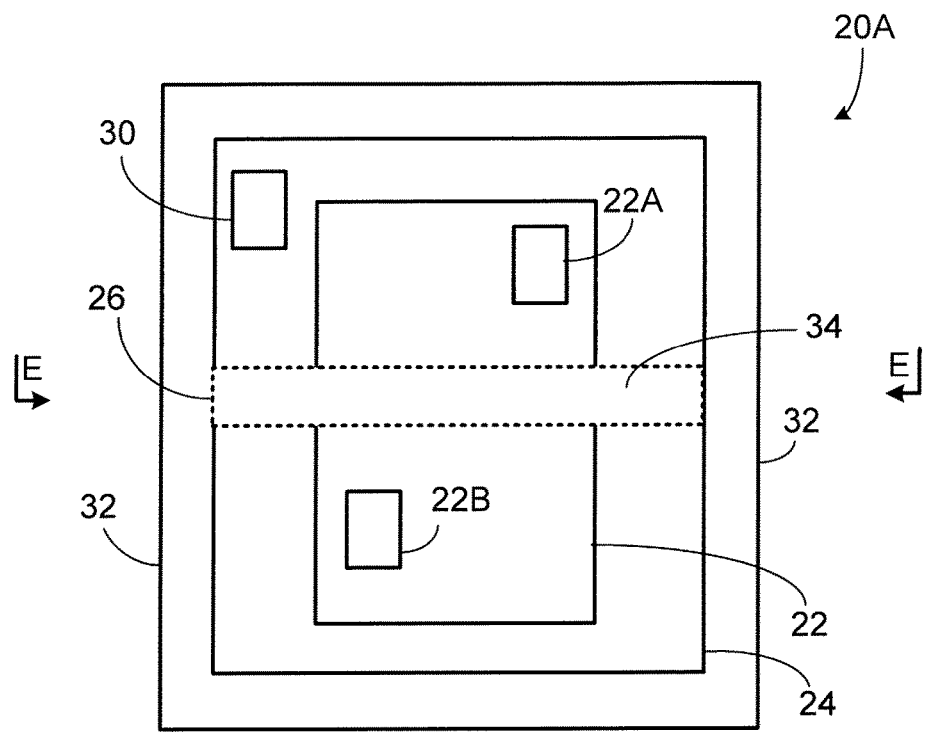
FIG. 8A is a top view arrangement of a second example of an optoelectronic module.
Figure 8B:
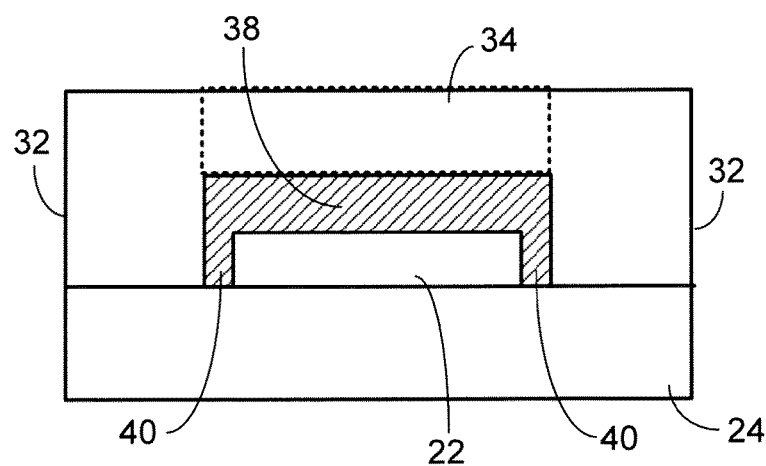
FIG. 8B is a cross-sectional side view of the module of FIG. 8A taken along line E-E.

In some implementations, instead of injecting adhesive into conduits in the bridge portion of the wall, adhesive 46 is dispensed from the side, for example, in one of the areas 40 between a side-edge 42 of the image sensor 22 and an inner edge 44 of the spacer 32, as illustrated by FIG. 7A. The adhesive 46 can be injected, for example, using a jetting technique. Surface forces draw the adhesive 46 over the top of the image sensor 22 so as to fill the space 38 (see FIG. 7B), without too much lateral spreading of the adhesive. In this way, the adhesive 46 can fill the spaces 38, 40, but not contaminate the sensitive regions 22A, 22B of the image sensor 22. In this implementation, the bridge portion 34 of the wall 26 does not include conduits for the adhesive. Thus, the width ('a') of the bridge 34 can be made somewhat smaller (e.g., 200 µm) than the corresponding width of the bridge in the example of FIG. 5. An example of the resulting module 20A is illustrated in FIGS. 8A and 8B.

Figure 9A:
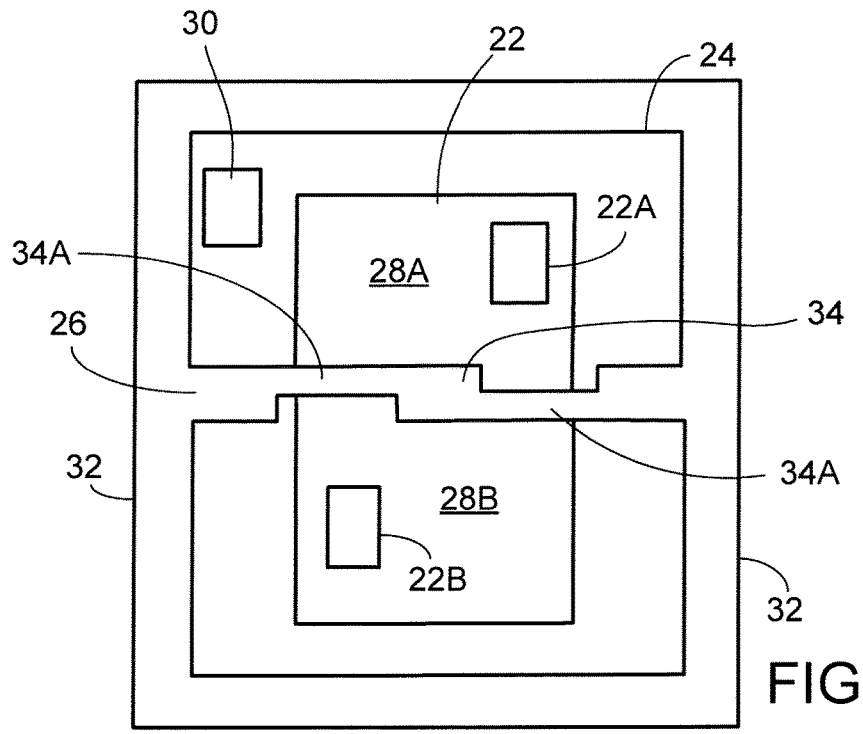
FIGS. 9A and 9B show top view arrangements of a third example of an optoelectronic module.
Figure 9B:
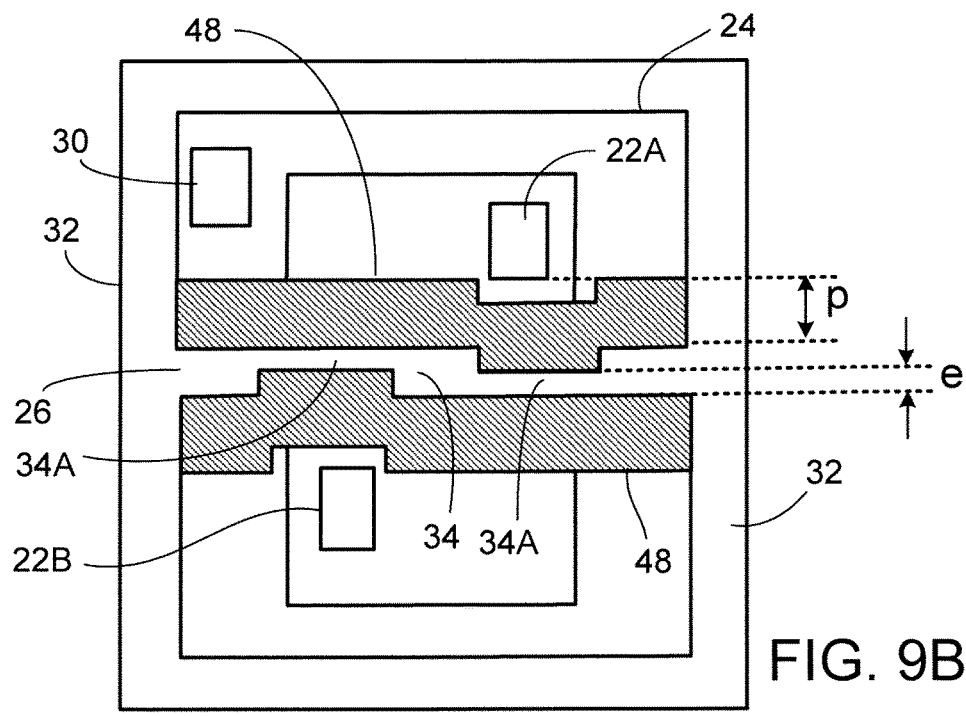

In some implementations, as shown in FIG. 9A, it can be advantageous to form a bridge 34 having narrow portions 34A each of which is opposite a sensitive region 22A, 22B of the image sensor 22. The thinner sections 34A can increase the lateral distance between the sensitive regions 22A, 22B of the image sensor 22 and the overflow meniscus 48 formed by the adhesive (see FIG. 9B). The thickness ('e') of the thinner portions 34A of the bridge 34 should be sufficiently large to ensure mechanical stability (e.g., e ≥100 µm). In some instances, the width ('p') of the meniscus 48 is in the range of 50-250 µm. These values may differ for some implementations.

Figure 10A:
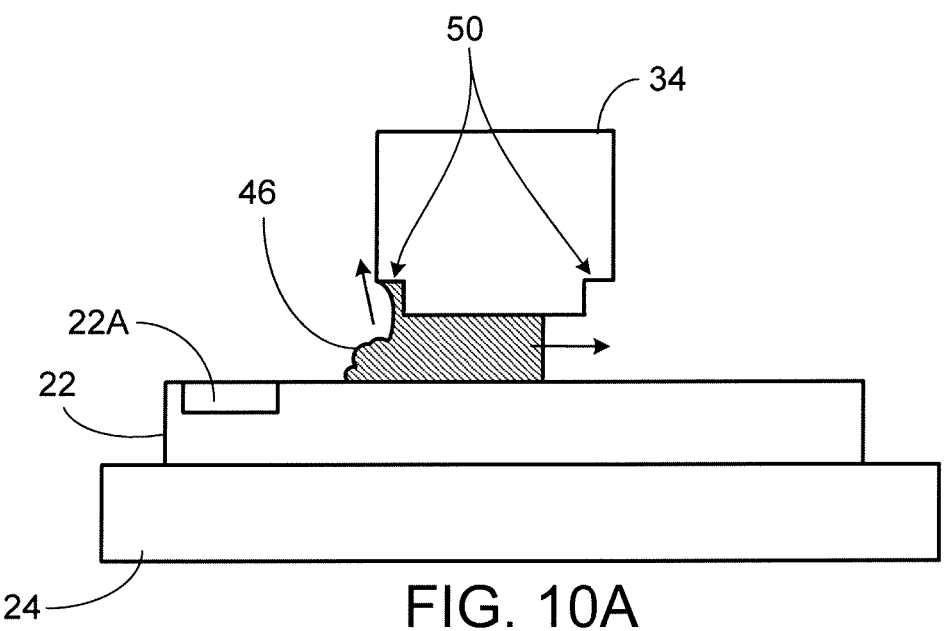
FIGS. 10A and 10B show further examples of a bridge portion of an internal module wall.
Figure 10B:
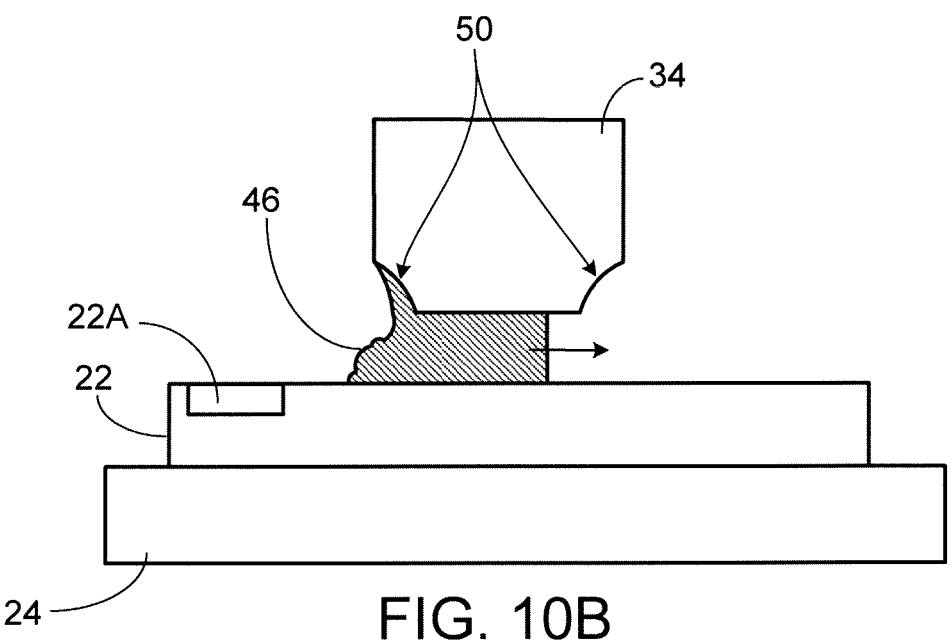

In the foregoing examples, the lower edges of the bridge portion 34 are substantially square. In some cases, however, the bridge portion 34 can have lower edges with cut-out regions 50 (see, e.g., FIGS. 10A, 10B). The cut-out regions 50 can allow the top of the overflow meniscus of the adhesive 46 to be drawn upwards. As more of the adhesive 46 is drawn upwards, the lateral spread of the overflow meniscus can be reduced, which can help keep the adhesive 46 away from the sensitive regions 22A, 22B of the image sensor 22. The cut-out regions 50 can have shapes other than those illustrated in FIGS. 10A-10B.

In the foregoing examples, the sensitive regions of the image sensor 22 are described as being optically sensitive regions (i.e., pixels) that may be damaged if the adhesive comes into contact with them. However, in some implementations, the sensitive regions may be other regions of the image sensor 22 that are, or may be, sensitive to contamination by the adhesive.

The foregoing modules can be fabricated using various several techniques, examples of which are described in detail below.

Figure 11:
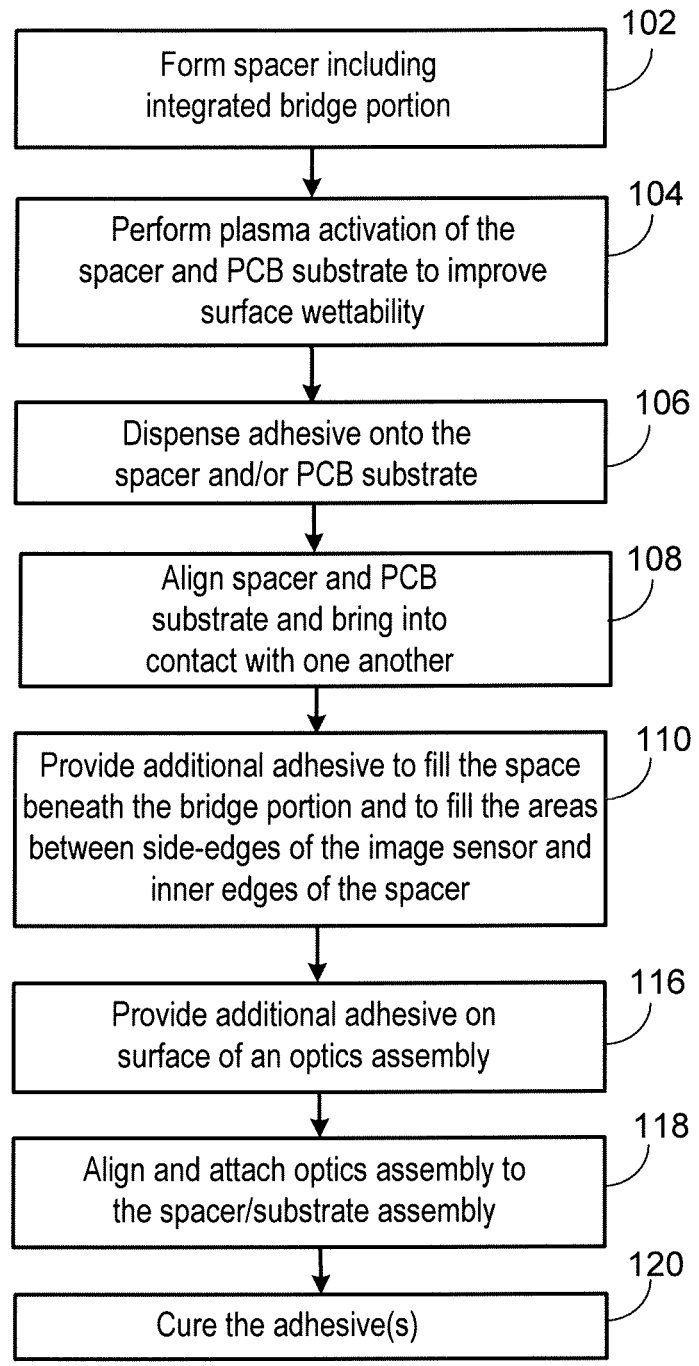
FIGS. 11-13 illustrate methods of fabricating the modules.

In a first fabrication method, a spacer 32, including an integrated bridge portion34, is formed, for example, by replication/paddle dispensing or vacuum injection molding (FIG. 11, block 102). Next, plasma activation (e.g., $O_2$ and heat) of the spacer 32 and a PCB substrate 24 (with the image sensor 22 mounted thereon) can be performed to improve wettability of the surfaces (104). Adhesive (e.g., thermally curable epoxy) then is dispensed onto the spacer 32 and/or the PCB substrate 24 (106), and the spacer 32 and PCB substrate 24 are aligned and brought into contact with one another (108). Additional adhesive (e.g., thermally or UV curable epoxy) is provided to fill the space 38 beneath the bridge portion 34 and the areas 40 between side-edges 42 of the image sensor 22 and inner edges 44 of the spacer 32

(block 110). Additional adhesive (e.g., thermally curable) is provided on the surface of an optics assembly (116), which is aligned and attached to the spacer/substrate assembly (118). The adhesive(s) then are cured, for example, thermally (120).

Figure 12:
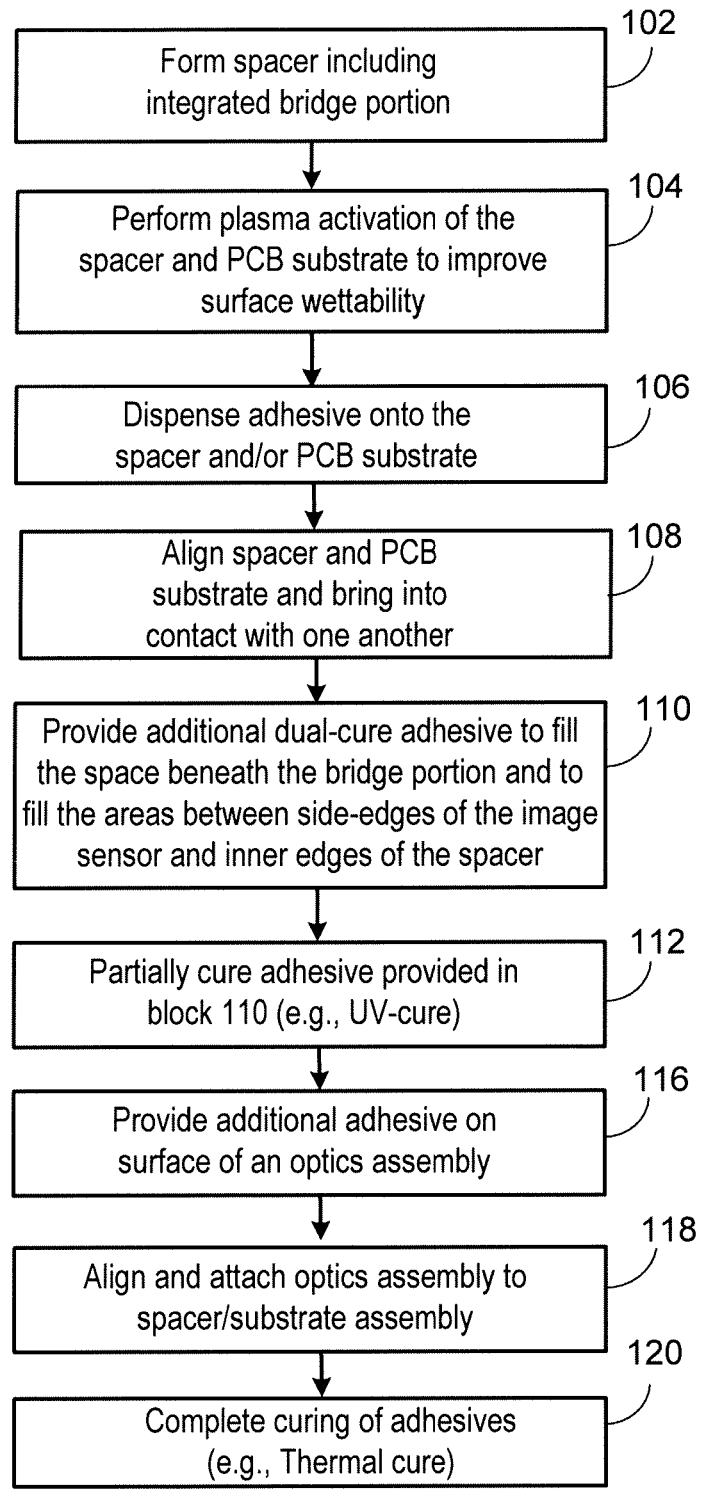

A second fabrication method is illustrated by FIG. 12. This method is similar to the method of FIG. 11, but also includes partially curing the additional adhesive provided in block 110 to fill the space 38 beneath the bridge portion 34 and the areas 40 between side-edges 42 of the image sensor 22 and inner edges 44 of the spacer 32. In this case, the adhesive provided in block 110 should be a dual-cure adhesive (e.g., requiring both UV and thermal curing to achieve complete curing of the adhesive). The partial flash cure (block 112), which can take place before block 116, can be performed, for example, using UV radiation and can help prevent the components from moving out of alignment during subsequent processing. The curing process can be completed in block 120 (i.e., using a thermal cure).

Figure 13:
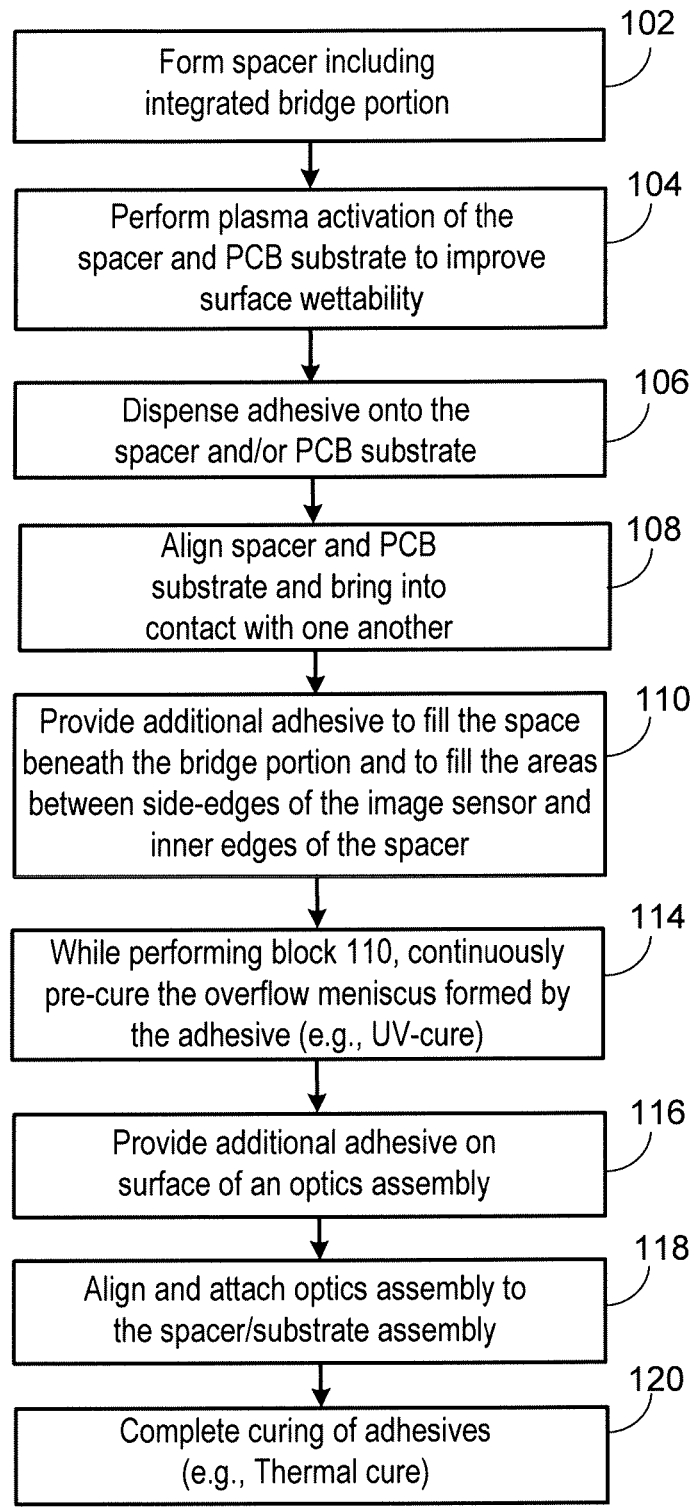
Figure 14:
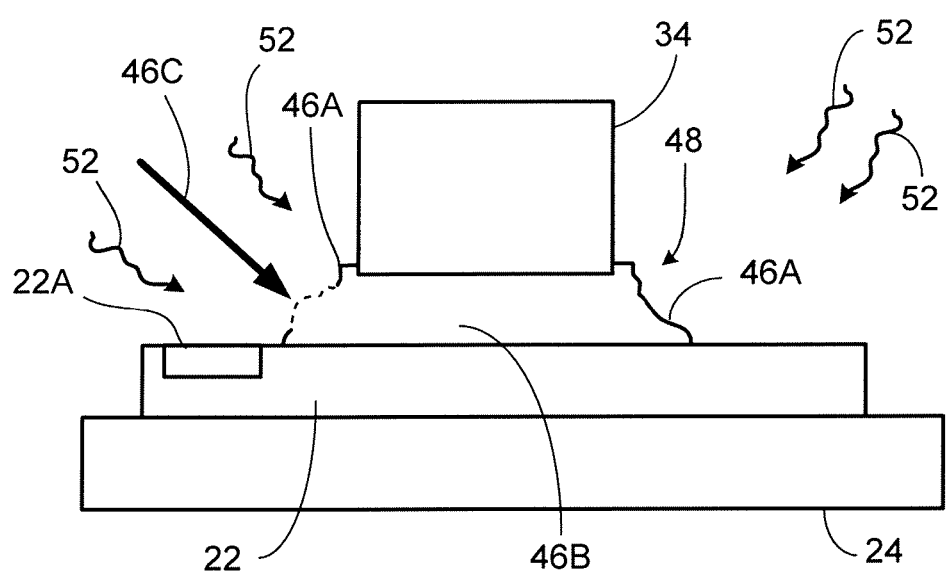
FIG. 14 illustrates pre-cure steps in the method of FIG. 13.

A third fabrication method is illustrated by FIG. 13. This method is similar to the method of FIG. 12, but instead of performing a flash cure (block 112) only after providing the adhesive (block 110), the overflow meniscus formed by the adhesive is exposed to UV radiation continuously as the meniscus develops (block 114). FIG. 14 illustrates an example of this pre-cure process (blocks 110 and 114). During the pre-cure process, as UV radiation 52 is directed at the overflow meniscus 48 as it forms, a cured adhesive shell 46A is formed, which helps prevent the adhesive from reaching the sensitive regions 22A, 22B of the image sensor 22. On the other hand, the uncured adhesive 46B under the bridge portion 34, as well as the adhesive 46C being applied, remains viscous, which allows more adhesive to be drawn under the bridge portion 34 so as to fill the space between the lower surface of the bridge portion 34 and the top surface of the image sensor 22. The curing process can be completed in block 120 (i.e., using a thermal cure).

Figure 15A:
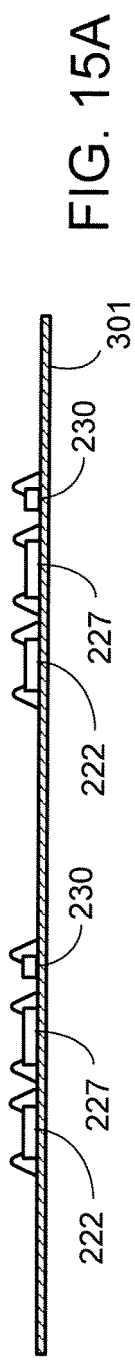
Figure 15B:
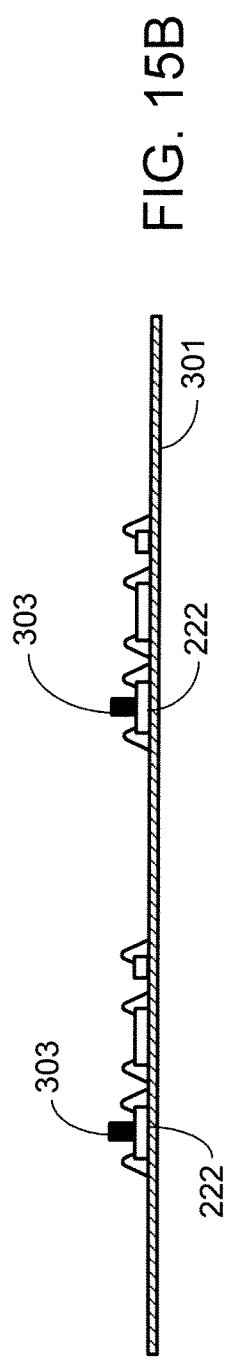
Figure 15C:
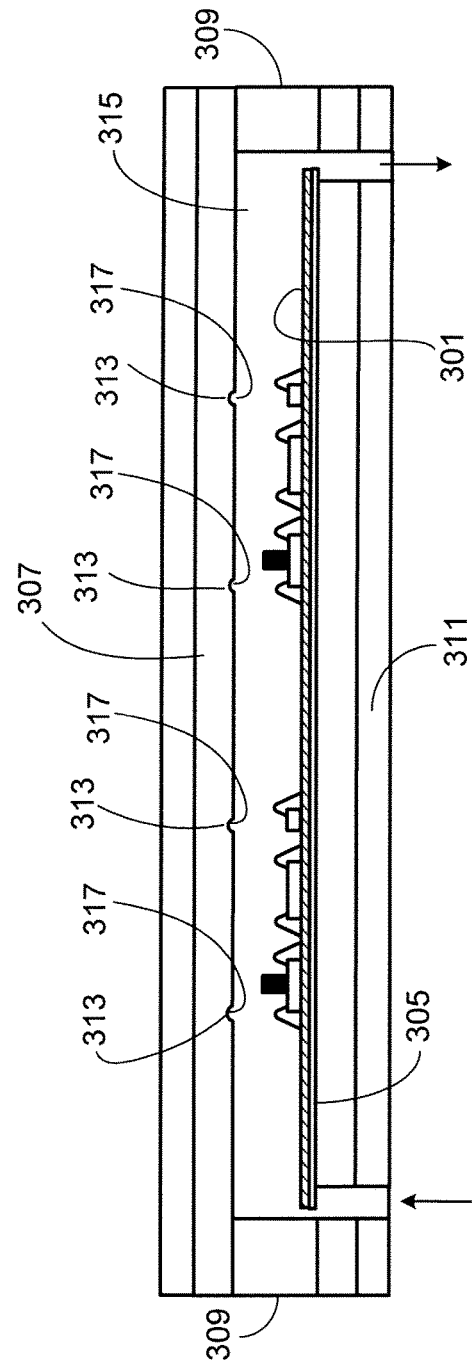
Figure 15D:
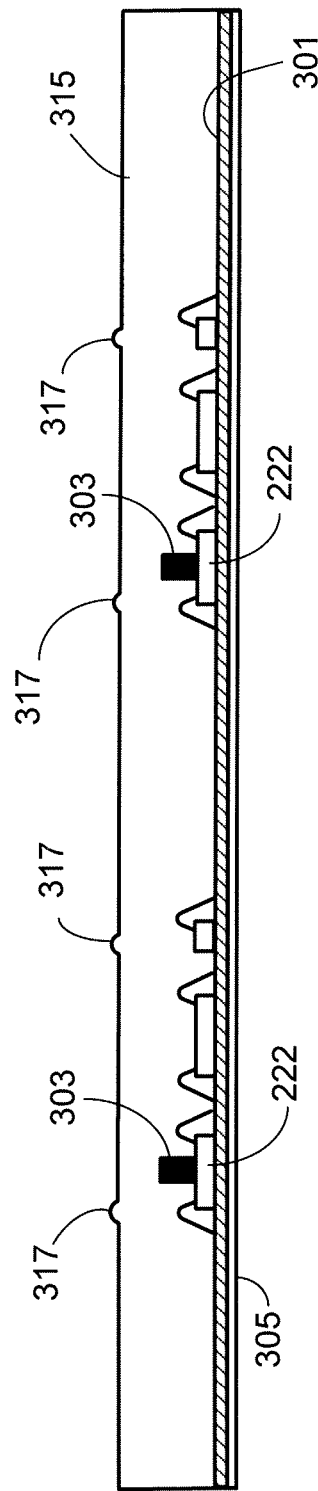
Figure 15E:
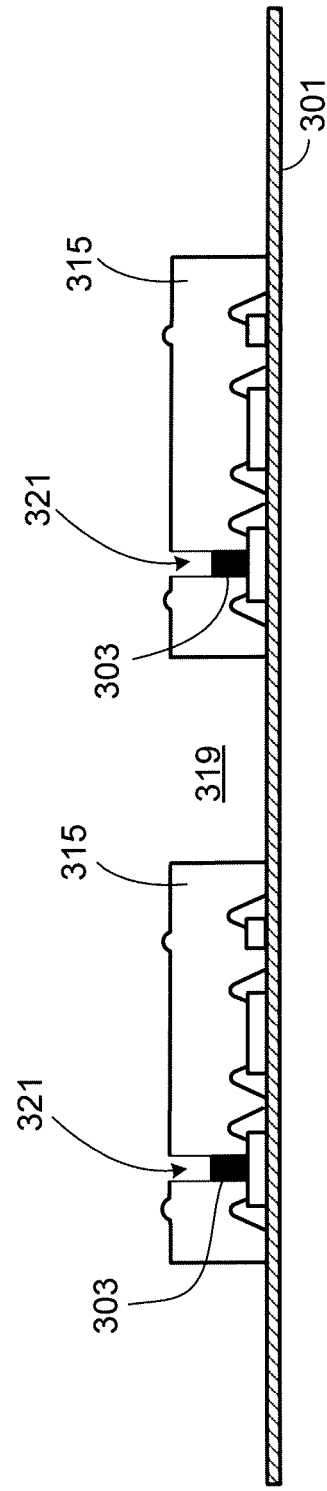
Figure 15H:
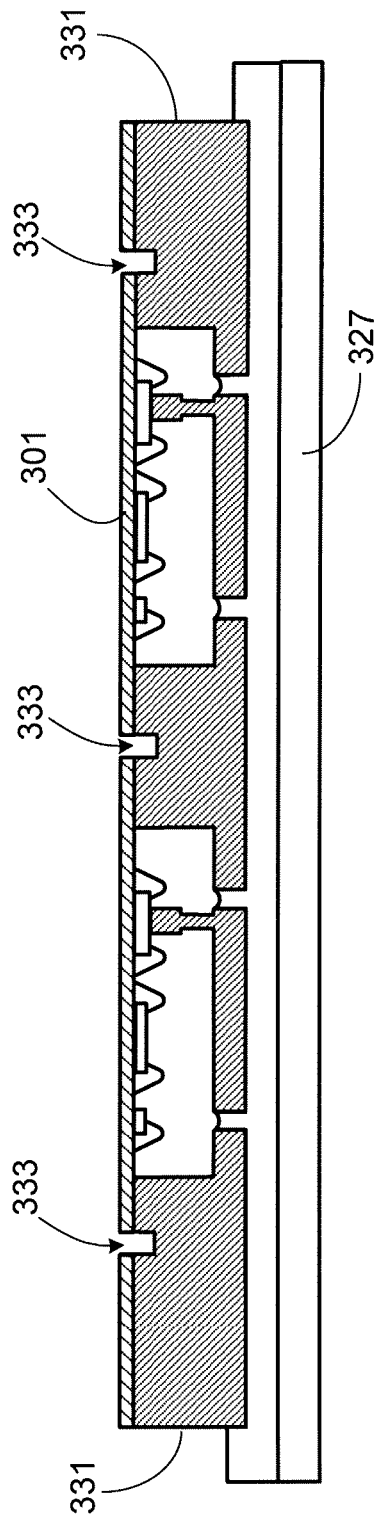
Figure 15I:
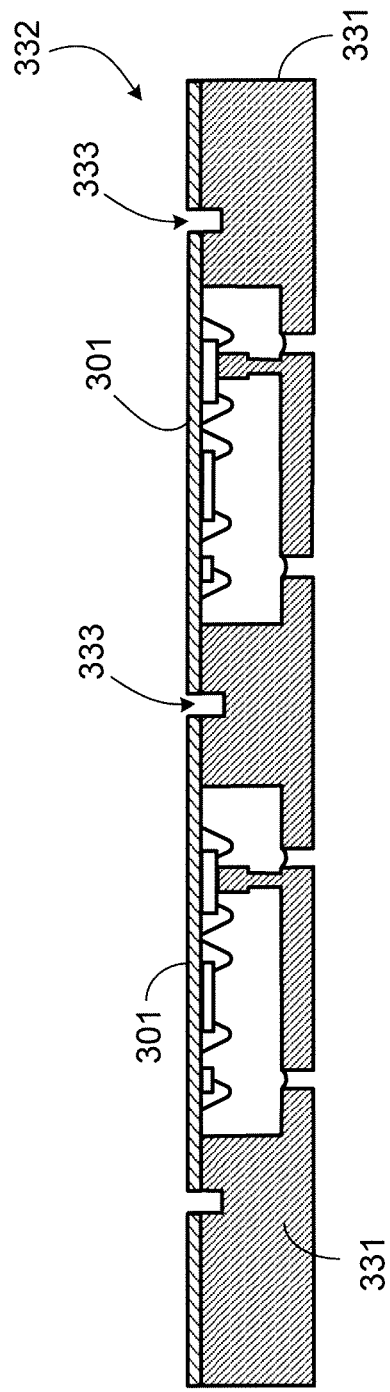
Figure 15L:
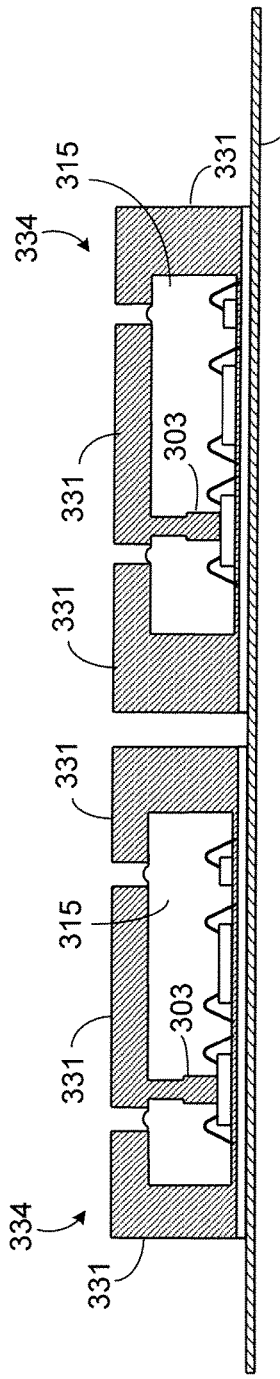
Figure 16:
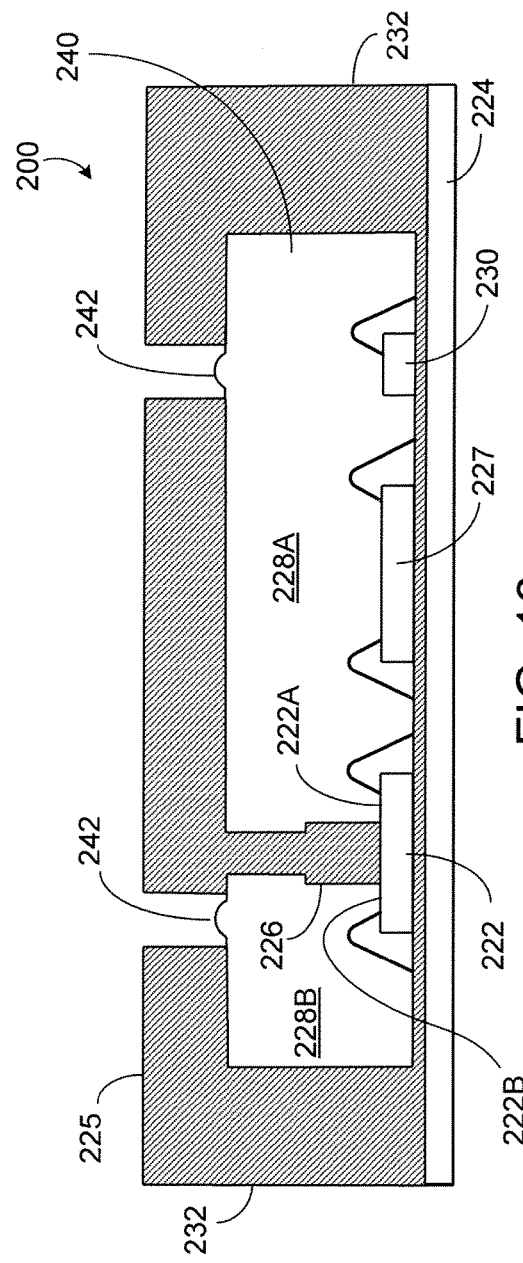
FIG. 16 illustrates an example of an optoelectronic module made by the method of FIGS. 15A-15L.

Another wafer-level fabrication method is illustrated in FIGS. 15A-15L and can be used to manufacture multiple modules such as the module 200 of FIG. 16, which includes an image sensor (e.g., time-of-flight (TOF) sensor) 222, a light emitter (e.g., VCSEL) 230, and an application-specific integrated circuit (ASIC) 227, each of which can be implemented, for example, as a semiconductor integrated chip mounted on a common PCB or other substrate 224. The sensor 222, the light emitter 230 and the ASIC 227 can be encased (i.e., overmolded), for example, with a clear epoxy 240, which, in some instances, also forms respective lenses 242 over the sensor 222 and the emitter 230. The module housing 225, including sidewalls 232 and a cover 225, as well as an internal wall 226 separating the module into two distinct chambers or optical channels 228A, 228B, can be composed, for example, of black epoxy. The wall 226 includes a bridge portion that spans across the sensor 222 such that each chamber 228A, 228B includes a respective image sensor region 222A, 222B that contains a subset of the sensor's pixels. As explained below, the bridge portion of the wall that spans across the sensors 222 can be formed in two epoxy dispensing/injection steps.

As shown in FIG. 15A, to make modules 200, a plurality of image sensors 222, ASICs 227 and light emitters 230 are mounted, for example, on a PCB substrate 301. Next, as shown in FIG. 15B, black epoxy is dispensed onto each TOF chip 222 to form a black epoxy foundation layer 303 for subsequent formation of the bridge portion of the wall 226. In some implementations, the height of the foundation layer 303, which can be provided, for example, using a dispensing valve, is about 30-50 µm. After dispensing the black epoxy for the foundation layer 303, the epoxy is cured thermally and/or by UV radiation.

As illustrated by FIG. 15C, the PCB substrate 301 is mounted to UV tape 305 and then is situated between a first bottom tool (i.e., a vacuum chuck/PDMS chuck) 311 and a second bottom tool 307, and is surrounded by a sealing plate 309 to facilitate further processing. The top tool 307 can include features 313 corresponding to the location of lenses. With the tools 307, 311 in place, clear epoxy is injected (either with or without vacuum) so as to form an overmold 315 for the sensors 222, the ASICs 227 and the emitters 230. The injected epoxy also forms lenses 317 defined by the features 313 (if present). The clear epoxy 315 then is cured (e.g., by UV radiation and/or heat). Thus, the same injection molding process can be used to form both the overmold 315 and the lenses 317.

Next, the assembly is de-molded by removing the assembly from the tools 307, 311 and the sealing plate 309. The resulting assembly is shown in FIG. 15D. The UV tape 305 then is removed, for example, by applying UV radiation.

As indicated by FIG. 15E, portions of the clear epoxy 315 are removed (e.g., mechanically) selectively from two different types of regions. In particular, the epoxy 315 is removed substantially from areas 319 between adjacent groups of the chips 222, 227, 230. As explained below, the areas 319 subsequently are filled in with black epoxy to form outer walls (i.e., spacers) for the modules. The clear epoxy 315 also is removed selectively from areas 321 directly above the foundation layers 303. For example, a narrow trench can be machined by dicing directly above the foundation layer 303 formed over each sensor chip 222. An advantage of having previously provided the foundation layer 303 is that it helps prevent the mechanical dicing from cutting into the top of the sensor chips 222. As explained below, the trenches 321 also subsequently are filled in with black epoxy so to complete the bridge portion of the wall 226 that spans across the sensor chip 222.

As illustrated by FIG. 15F, the PCB substrate 301 is mounted to UV tape 323 and then is situated between a first top tool (i.e., a PDMS baffle tool) 327 and a second bottom tool (i.e., a PDMS chuck) 325, and is surrounded by a sealing plate 329 to facilitate further processing. With the tools 325, 327 in place, black epoxy 331 is injected (either with or without vacuum). The portions of the injected black epoxy 331 that fill the trenches 321 come into contact with the previously formed foundation layers 303, thereby completing the bridge portion of the wall across the sensor chips 222. As the black epoxy 331 fills the trenches 321, it also forms the outer housing (i.e., sidewalls and cover) for the modules. The top tool 327 also can include features to seal and protect the lenses during injection of the black epoxy 331. The epoxy 331 then is cured, for example, thermally and/or by UV radiation.

Next, as indicated by FIG. 15G, the bottom tool 325 is removed from the assembly, and the UV tape 323 is removed as well. In some cases, with the first tool 327 still in place, the entire assembly is flipped over (see FIG. 15H), and trenches 333 are formed (e.g., by laser trenching) through the PCB substrate 301 in areas between adjacent groups of the chips 222, 227, 230. The trenches 333 can extend somewhat into the black epoxy 321. In some cases, the trenches 333 can help relieve warping that may be present in the PCB/spacer structure. In other cases, the trenches 333 can enable correction of such warping when the assembly is mounted to another support during subsequent processing.

After forming the trenches 333, the first tool 327 is removed (see FIG. 15I), and UV dicing tape 335 is fixed to the same side of the resulting assembly 332 from which the first tool 327 was removed (see FIG. 15J). Next, the resulting assembly 332 is singulated into individual modules by dicing through the black epoxy 331 at the location of each of the trenches 333. The dicing is performed vertically through the black epoxy 331 until the UV dicing tape 335 is reached, thereby separating the assembly 332 into multiple individual modules 334 (see FIG. 15K). Following singulation, the UV dicing tape 335 is removed, and the PCB substrate 301 of each module 334 is attached to high-temperature tape 337 (see FIG. 15L). The modules 334 then are hard-baked (e.g., 120° C. for one hour) so to fully cure the epoxies 315, 331. Singulation of the assembly 332 into individual modules 334 preferably should take place before the hard-baking so as to avoid warping, breakage and/or delamination of the various components. Before removing the modules 334 from the high-temperature tape 337, an automated optical inspection can be conducted. After removing the high-temperature tape 337, the result is multiple modules like the module 200 of FIG. 16.

As described above in connection with FIG. 7A, in some implementations, adhesive (e.g., epoxy) 46 can be injected, for example, using a jetting technique to fill the space 38 between the bridge portion 34, the spacer 32 and PCB substrate 24. However, jetting techniques typically permit only the use of low viscosity epoxy, which may overflow onto sensitive regions of the sensor 22. Further, in some cases, low viscosity epoxy may make it more challenging to build up the height of the epoxy. To alleviate such issues, a multi-step three-dimensional (3D) printing technique can be used to form a wall, or bridge, that spans across the sensor chip and that separates the module into two chambers. In this case, however, the bridge is formed directly on a spacer, and subsequently a PCB substrate, on which the sensor chip is mounted, is attached to the spacer such that the bridge spans across the sensor chip and separates the module into two chambers.

Figure 17:
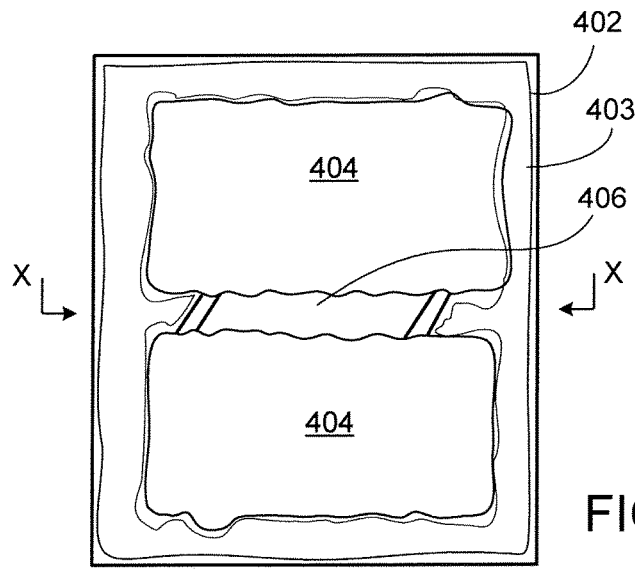
FIG. 17 is a top view of spacer.
Figure 18A:
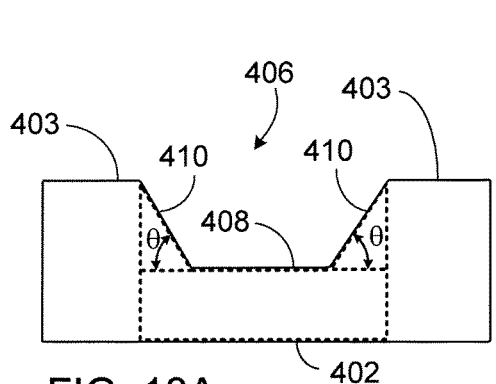
FIGS. 18A-18D are cross-sectional side views of the spacer, taken along lines x-x, during different stages of building up a wall on a bridge portion.
Figure 18C:
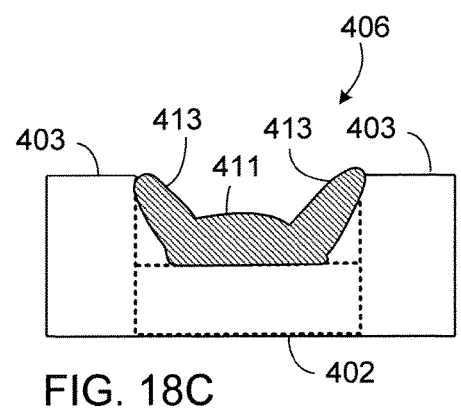
Figure 18B:
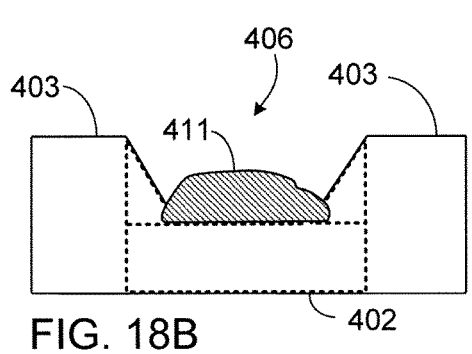
Figure 18D:
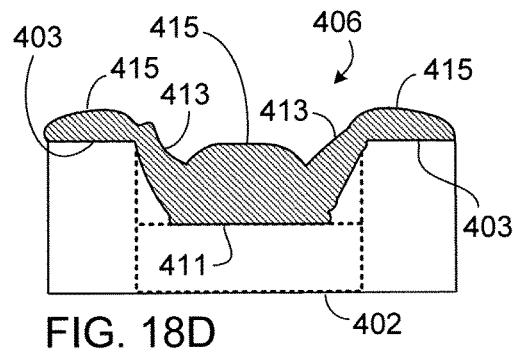
Figure 19A:
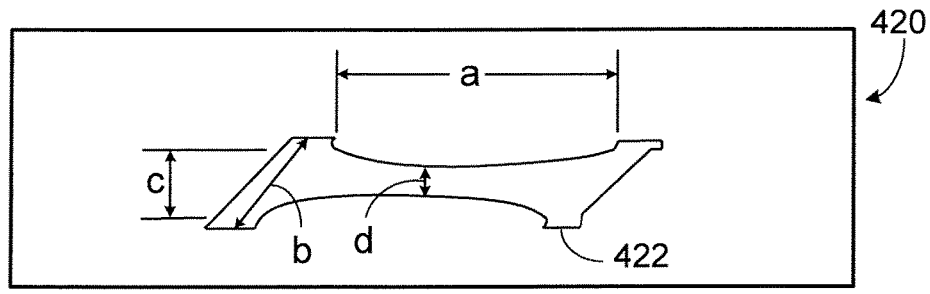
FIGS. 19A-19C illustrate examples of screens for building up the wall of FIGS. 18B-18D.
Figure 19B:
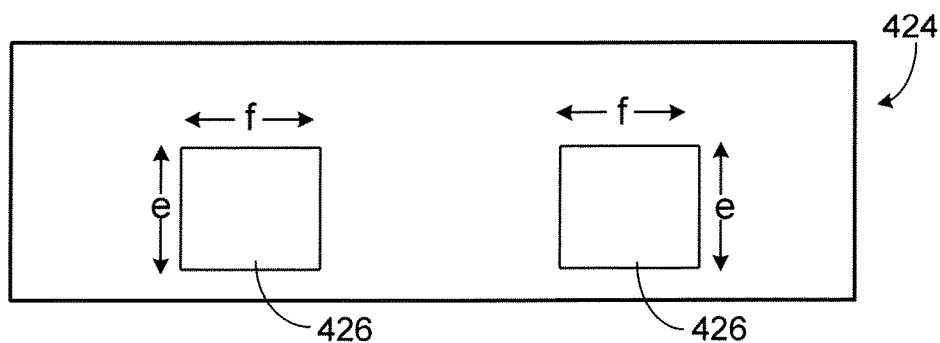
Figure 19C:
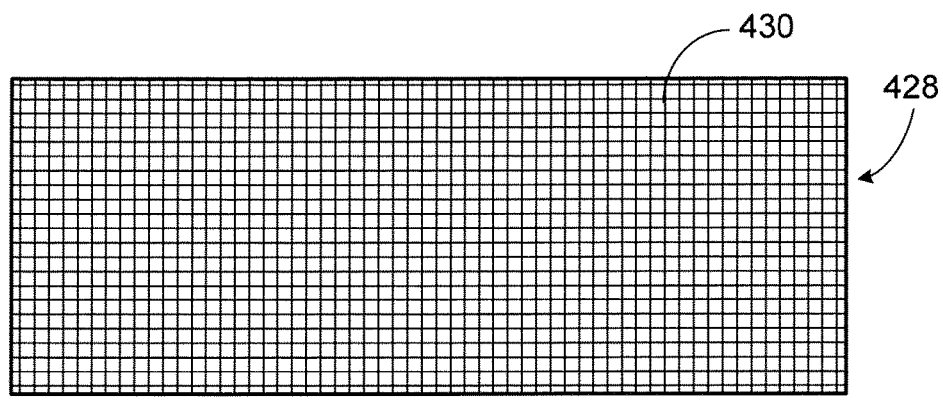

As illustrated in FIG. 17, a spacer 402 defines a frame that has openings 404 corresponding to two optical channels for the module. One surface 403 of the spacer 402 includes a bridge region 406 across its width. FIG. 18A illustrates a cross-sectional side view of the spacer 402 (taken along lines x-x in FIG. 17) prior to depositing the epoxy to build up the bridge. As can be seen in FIG. 18A, the bridge region 406 has a valley region 408 and shoulders 410 that form an angle θ. In some instances, the angle θ is about 60°, although other angles may be appropriate for some implementations. As described below, several screens (see FIGS. 19A, 19B, 19C) are used in sequence to selectively apply high viscosity epoxy onto the spacer 402 so as to build up the bridge (see FIGS. 18B, 18C and 18D).

A first screen 420 (FIG. 19A) is placed over the surface 403 of the spacer 402, and high viscosity epoxy is pushed through the opening 422 in the screen 420. The opening 422 is shaped and positioned so that the epoxy 411 is deposited in the valley region 408 of the spacer (see FIG. 18B). Preferably, the first screen 420 is designed to prevent overflow of the epoxy 411 onto the sensitive areas of the sensor chip (i.e., when the spacer is attached to a substrate on which the sensor chip is mounted). For example, in a particular implementation, the dimensions of the opening 422 in the first screen 420 can be as follows: a=600 μm; b=400 μm; c=250 μm; d=175 μm. Other dimensions or shapes may be appropriate for other implementations.

Next, the first screen 420 is removed from the spacer 402, and a second screen 424 is placed over the surface 403 of the spacer. Additional high viscosity epoxy is pushed through openings 426 in the screen 424. The openings 426 are shaped and positioned such that the additional epoxy 413 is deposited on the shoulders 410 of the spacer (see FIG. 18C). For example, in a particular implementation, the dimensions of the opening 426 in the second screen 424 can be as follows: e=250 μm; f=300 μm. Other dimensions or shapes may be appropriate for other implementations.

Next, the second screen 424 is removed from the spacer 402, and a third screen 428 is placed over the surface 403 of the spacer. Additional high viscosity epoxy is pushed through openings 430 in the screen 428. The third screen 428 has many small openings 430 that can be uniformly spaced. Additional high viscosity epoxy is pushed through the openings 430 so that epoxy 415 is deposited more or less uniformly over the entire surface 403 of the spacer (see FIG. 18D).

Figure 20:
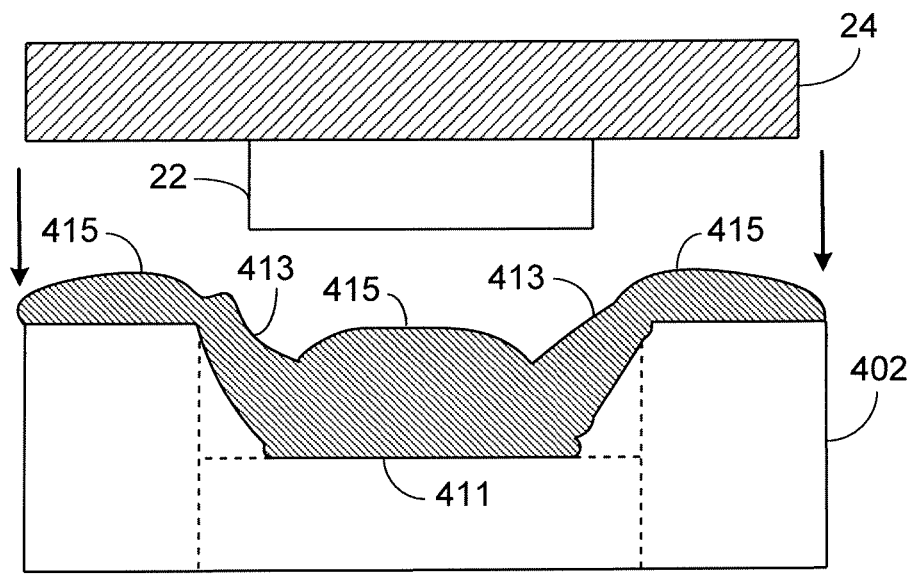
FIG. 20 illustrates attachment of a substrate and sensor chip to the spacer of FIG. 18D.
Figure 21:
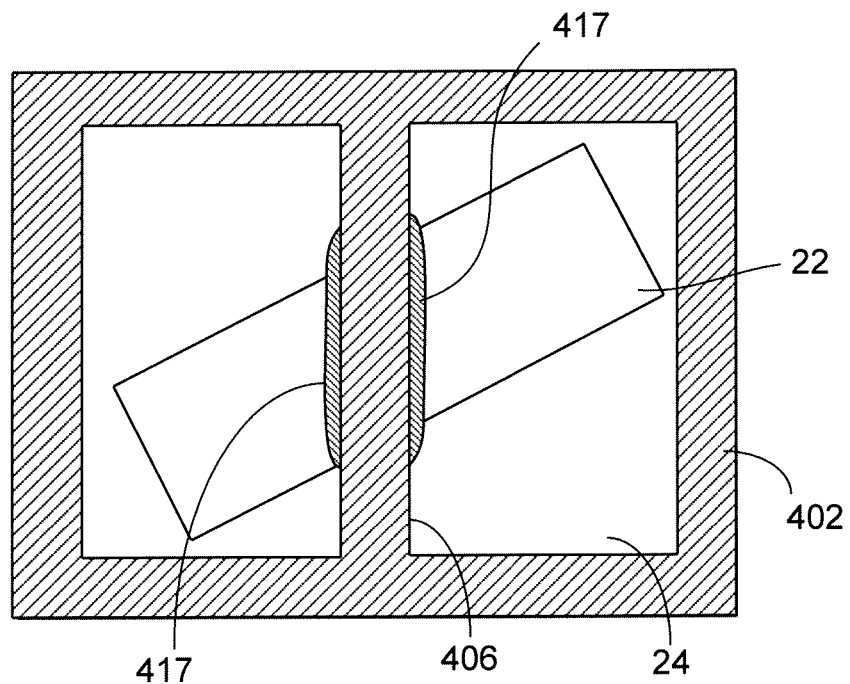
FIG. 21 illustrates a top view of the spacer of FIG. 18D attached to a substrate on which is mounted a sensor chip.

After deposition of the epoxy 411, 413, 415 (collectively referred to as epoxy 417) on the spacer 402, the epoxy is cured (e.g., thermally and/or by UV radiation). Once the epoxy 417 is hardened, a PCB or other substrate 24, on which a TOF or other image sensor chip 22 is mounted, is attached to the epoxy-side of the spacer 402, as shown in FIG. 20. The epoxy 417 below the bridge portion 406 of the spacer 402 forms part of a wall that spans across the sensor chip 22. An optics assembly (including lenses) then can be attached over the spacer to complete the module. The internal wall, formed by the bridge portion 406 of the spacer 402 and the epoxy 417 extending over the sensor chip 22, separates the module into two chambers that are optically isolated from one another. Each chamber can contain respective light sensitive portions of the sensor chip 22.

The foregoing fabrication methods can, in some instances, be performed on a wafer-level. Wafer-level processes allow multiple modules to be fabricated at the same time. Generally, a wafer refers to a substantially disk- or plate-like shaped item, its extension in one direction (y-direction or vertical direction) is small with respect to its extension in the other two directions (x- and z- or lateral directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction.

Other implementations are within the scope of the claims.

What is claimed is:

1. A wafer-level method of fabricating a plurality of optoelectronic modules, the method comprising:
providing a substrate on which are mounted a plurality of image sensor chips;
providing a respective foundation layer of black epoxy over each respective one of the image sensor chips such that a first light sensitive region of the respective image sensor chip is located to a first side of the respective foundation layer and a second light sensitive region of the respective image sensor chip is located to a second side of the respective foundation layer;
providing an overmold of clear epoxy over the image sensor chips;
selectively removing the clear epoxy from areas directly over the foundation layers so as to form a respective first trench directly over each foundation layer; and performing an injection process to fill the first trenches with black epoxy and simultaneously to form an outer housing of black epoxy for the modules.

2. The method of claim 1 further including dicing the substrate to form a plurality of singulated modules, each of which includes a respective image sensor chip having a bridge portion composed of the black epoxy spanning over the image sensor chip so as to separate the first and second light sensitive regions of the image sensor chip from one another.

3. The method of claim 2 further including hard baking the black epoxy after dicing the substrate to form the plurality of singulated modules.

4. The method of claim 1 including:
- forming second trenches through the substrate, each of the second trenches extending partially into the black epoxy;
- fixing a UV dicing tape to a side of the black epoxy opposite the substrate;
- dicing through the black epoxy to form a plurality of singulated modules, wherein the dicing is performed at locations of the second trenches;
- removing the UV dicing tape, and attaching the plurality of modules to a high-temperature tape; and
- thermally curing the black epoxy.

5. The method of claim 1 wherein lenses composed of the clear epoxy are formed integrally with the overmold of clear epoxy, and wherein the lenses and the overmold are formed during a single injection molding process.

* * * * *